United States Patent
Suzuki

(10) Patent No.: US 7,424,081 B2
(45) Date of Patent: Sep. 9, 2008

(54) SEMICONDUCTOR INTEGRATED CIRCUIT DEVICE

(75) Inventor: Kazuhisa Suzuki, Hamura (JP)

(73) Assignee: Hitachi, Ltd., Tokyo (JP)

( * ) Notice: Subject to any disclaimer, the term of this patent is extended or adjusted under 35 U.S.C. 154(b) by 798 days.

(21) Appl. No.: 10/863,258

(22) Filed: Jun. 9, 2004

(65) Prior Publication Data

US 2005/0008111 A1    Jan. 13, 2005

(30) Foreign Application Priority Data

Jul. 10, 2003    (JP) ............................. 2003-194743

(51) Int. Cl.
*H04L 7/00*    (2006.01)
(52) U.S. Cl. .................. 375/371; 375/374; 375/376
(58) Field of Classification Search ............... 375/371, 375/376, 374, 375, 373; 327/148, 150
See application file for complete search history.

(56) References Cited

U.S. PATENT DOCUMENTS

| | | | | |
|---|---|---|---|---|
| 5,138,635 | A * | 8/1992 | Ballance | 375/356 |
| 5,910,741 | A * | 6/1999 | Watanabe | 327/150 |
| 6,798,858 | B1 * | 9/2004 | Atallah et al. | 375/373 |
| 7,027,548 | B1 * | 4/2006 | Palusa et al. | 375/375 |
| 7,092,471 | B2 * | 8/2006 | Lentine et al. | 375/371 |
| 2001/0028266 | A1 | 10/2001 | Taniguchi | |
| 2004/0234014 | A1 * | 11/2004 | Chen | 375/350 |
| 2005/0017810 | A1 * | 1/2005 | Lin | 331/25 |
| 2005/0262373 | A1 * | 11/2005 | Kim | 713/401 |

FOREIGN PATENT DOCUMENTS

JP    2001-186111    7/2001

* cited by examiner

*Primary Examiner*—Chieh M. Fan
*Assistant Examiner*—Jaison Joseph
(74) *Attorney, Agent, or Firm*—Mattingly, Stanger, Malur & Brundidge, PC

(57) ABSTRACT

An error rate of a bit synchronous circuit is decreased to a large extent by preventing following excessively the jitters included in input data. A phase detect circuit of a bit synchronous circuit includes a majority decision circuit. The majority decision circuit counts UP0 and DN0 signals as a phase comparison result of comparing phases by a UP0 counter and a DN0 counter for a period of time, and its count number is judged by a magnitude relation determination circuit. The magnitude relation determination circuit outputs an UP signal if the UP0 signal is majority, a DN signal if the DN0 signal is majority, and a FIX signal if the UP0 signal is equal to the DN0 signal. Accordingly, since it is possible to prevent following the jitters included in input data, etc., an error rate for bit synchronization can be reduced to a large extent.

12 Claims, 19 Drawing Sheets

SEMICONDUCTOR INTEGRATED CIRCUIT DEVICE

CLAIM OF PRIORITY

The present invention claims priority from Japanese application JP 2003-194743 filed on Jul. 10, 2003, the content of which is hereby incorporated by reference into this application.

FIELD OF THE INVENTION

The present invention generally relates to phase control technique for data and clocks. More particularly, the present invention relates to effective application technique for reducing an error rate for a bit synchronization circuit.

BACKGROUND OF THE INVENTION

Conventionally, a bit synchronization circuit and the like, which correspond to various user's use conditions, are provided in a custom IC such as an application specific integrated circuit (ASIC).

This bit synchronization circuit is a circuit for latching input data that are input asynchronously using a half cycle delayed clock from a data edge, which is output from a multiphase output phase locked loop (PLL) and synchronizing with clocks in a receiving side.

Further, error avoidance technique for latching data of the bit synchronization circuit has been known, which decides a clock having level transition timing in a central portion of level transition timing from data being adjacent alternately and identified by a phase clock which is different by majority decision with time series of a phase detect output (for example, refer to the patent document 1).

Further, as reducing technique of the jitters of delay locked loop (DLL), phase matching technique between a delay clock and a standard clock has been known by adjusting delay time based on plural phase comparison results between the standard clock and the delayed clock of a phase detect circuit by deciding the majority of phase comparison results (for example, refer to the patent document 2).

[Patent document 1] JP-A No. 186111/2001

[Patent document 2] U.S. Pat. No. 2001/28266A1

However, the following problems are found by the inventor in data latching technique of the foregoing bit synchronization circuit:

FIG. 26 is a block diagram of a bit synchronization circuit 50 which has been examined by the inventor.

The bit synchronization circuit 50 includes, for example, a flip-flop 51, a phase detect circuit 52, a pointer 53, a selector 54, and a multiphase clock output PLL 55.

The flip-flop 51 latches input data. The phase detect circuit 52 compares phases between input data and a clock phase having a half cycle forward to a clock of latching the foregoing data, and an UP (up) or DN (down) signal is output based on its comparison result.

The pointer 53 controls the selector 54 by receiving the UP or DOWN signal. The selector 54 changes and supplies a clock phase that is output from the multiphase clock output PLL 55 to the flip-flop 51, based on the control of the pointer 53.

In the bit synchronization circuit 50 for selecting such a clock phase, latency up to the time that the clock phase supplied to the flip-flop 51 changes by operating the pointer 53 and the selector 54 based on the results of phase comparison becomes large after comparing phases.

Thus, if the UP or DOWN signal is output to a pointer every time that a phase detect circuit compares the phases, as indicated in FIG. 27, in the event that the jitters are caused severely in the input data, data latching clock also changes by following the foregoing jitters after delay time.

Thus, a problem arises, in which data are acquired by a delay clock phase different from a clock phase for a period of the foregoing delay time, even if a data edge returns to an original position, and the error rate of latching data becomes large in the worst case since data cannot be read correctly.

Further, in the bit synchronization circuit as set forth in the patent document 1, a synchronous error, such as the jitters and SNR degradation, is prevented by deciding the three bit majority of the result of the phase detect circuit 3 in a time-series way. Although the synchronous error can be prevented from comparatively fast changing noises within input cycle time, such as the jitters because phase matching between the data and the clock is performed at the time of inputting BSEN, the situation of containing fluctuation, a so-called wander, caused more slowly than cycle time of the input data in the input data has not been considered. Thus, the inventor noticed that a latching error might be caused in the worst case.

Further, in a delay control circuit 34 using the majority circuit as mentioned in FIG. 4 of the patent document 2, three values such as a forward signal FW, a backward signal BW, and a coincidence signal LON are input from a phase detect circuit 20, and phase matching is made by deciding its majority. Because three values are input from the phase detect circuit 20, each corresponding counter must however be provided. Thus, the inventor noticed that circuit diagram size and power dissipation became large.

Further, during phase matching using the majority decision circuit, if the number of majority decision counts of the majority decision circuit is small, then operation time from starting synchronization to actual synchronization becomes short, but the tolerance of the jitters becomes low. On the other hand, the inventor noticed that operation time from starting synchronization to actual synchronization became long although the tolerance of the jitters became high if the number of majority decision counts was large.

SUMMARY OF THE INVENTION

It is an object of the present invention to provide a semiconductor integrated circuit device capable of reducing an error rate to a large extent of a bit synchronization circuit by preventing following excessively the jitters caused in input data.

Further, it is another object of the present invention to provide a semiconductor integrated circuit device capable of reducing the amount of changing phases of data and output clocks of the DLL circuit and the PLL circuit to a large extent by preventing following excessively the jitters contained in the data and reference clocks.

The foregoing object, another object, and a novel characteristic of the present invention will be apparent from the description of the specification and the accompanying drawings.

The main aspects of the present invention disclosed in the present application are briefly summarized and explained in the following:

A semiconductor integrated circuit device of the present invention comprises a phase detect circuit including a phase detector for comparing phases between a first signal and a second signal and outputting first or second control voltage in accordance with difference of phases and a majority decision circuit for counting first and second control voltages output from the foregoing phase detector for a fixed period of time and outputting an UP signal when the foregoing first control voltage count is larger than the foregoing second control voltage count, a DOWN signal when the foregoing second control voltage count is larger than the foregoing first control voltage count, or a FIX signal when the foregoing first control voltage count is equal to the foregoing second control voltage count, in which the foregoing majority decision circuit can change arbitrarily a period of counting the foregoing first and second control voltage output from the foregoing phase detector based on a period setup signal.

Further, other aspects of the present invention are summarized in the following:

A semiconductor integrated circuit device of the present invention comprises a phase detect circuit including a phase detector for comparing phases between input data and a clock and outputting first or second control voltage in accordance with difference of phases, a majority decision circuit for counting first and second control voltage output from the foregoing phase detector for a fixed period of time and outputting an UP signal when the foregoing first control voltage count is larger than the foregoing second control voltage count, a DOWN signal when the foregoing second control voltage count is larger than the foregoing first control voltage count, or a FIX signal when the foregoing first control voltage count is equal to the foregoing second control voltage count, and a majority decision count control register for storing majority decision count control data, in which the majority decision circuit setups the count number of the first and second control voltages that are output from the phase detector based on the majority decision count control data latched in the majority decision count control register.

A semiconductor integrated circuit device of the present invention comprises a phase detect circuit including a phase detector for comparing phases between input data and a clock and outputting first or second control voltage in accordance with difference of phases, and a majority decision circuit for counting first and second control voltages output from the foregoing phase detector for a fixed period of time and outputting an UP signal when the foregoing first control voltage count is larger than the foregoing second control voltage count, a DOWN signal when the foregoing second control voltage count is larger than the foregoing first control voltage count, or a FIX signal when the foregoing first control voltage count is equal to the foregoing second control voltage count.

These and other objects, features and advantages of the present invention will become more apparent in light of the detailed description of a preferred embodiment thereof, as illustrated in the accompanying drawings.

DETAILED DESCRIPTION OF THE PREFERRED EMBODIMENTS

Preferred embodiments of the present invention are explained below with reference to the drawings.

First Embodiment

Figure 1:
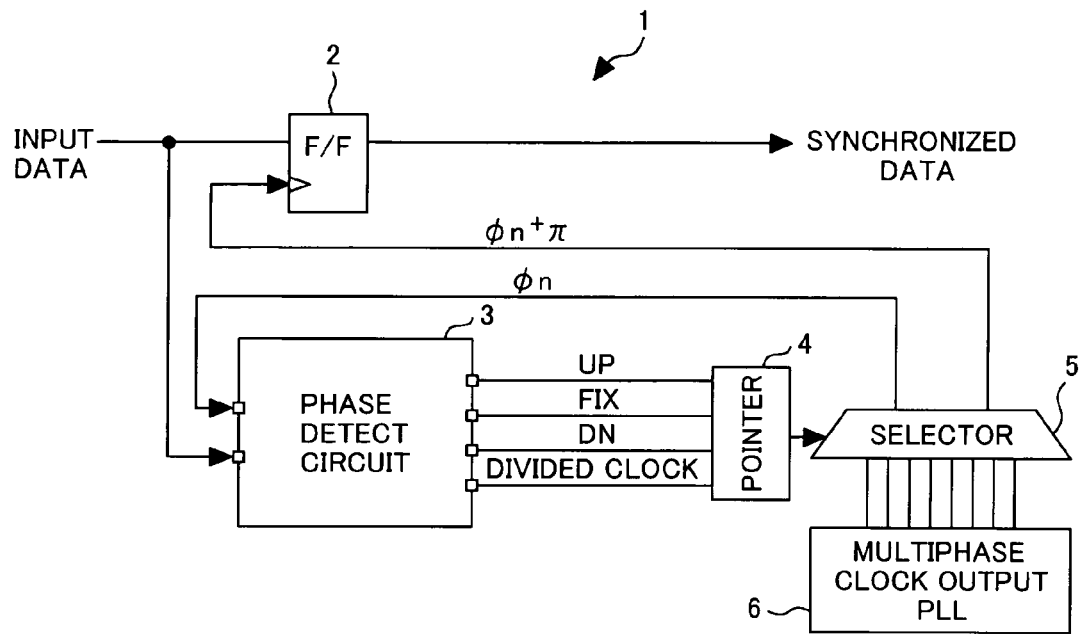
FIG. 1 is a block diagram of a bit synchronization circuit in the first embodiment of the present invention.
Figure 2:
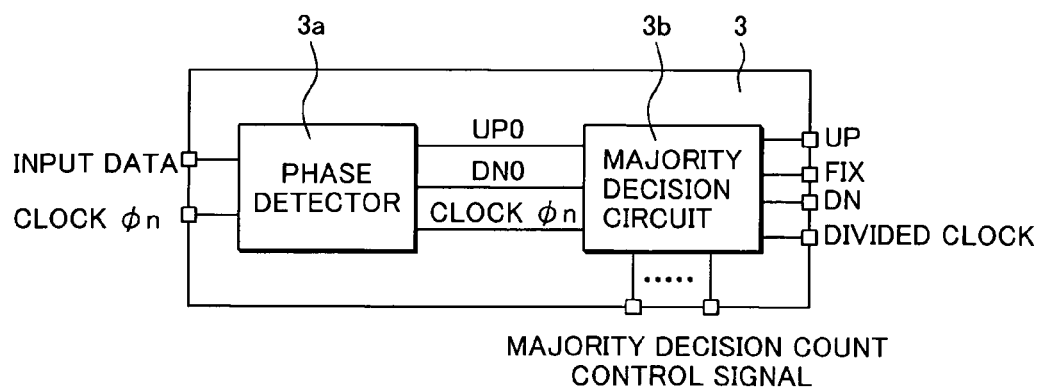
FIG. 2 is a block diagram of a phase detect circuit provided in the bit synchronization circuit in FIG. 1.
Figure 3:
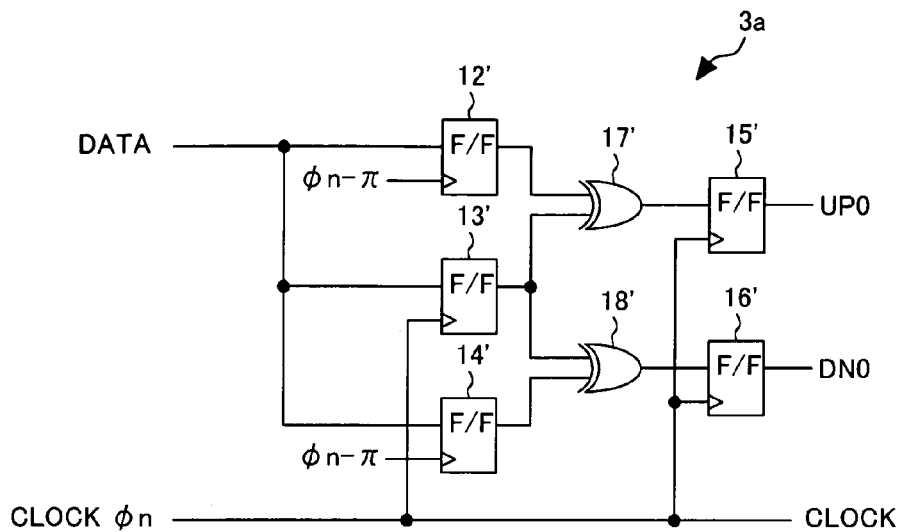
FIG. 3 is an example of a circuit diagram of a phase detect circuit using multiphase clocks.
Figure 4:
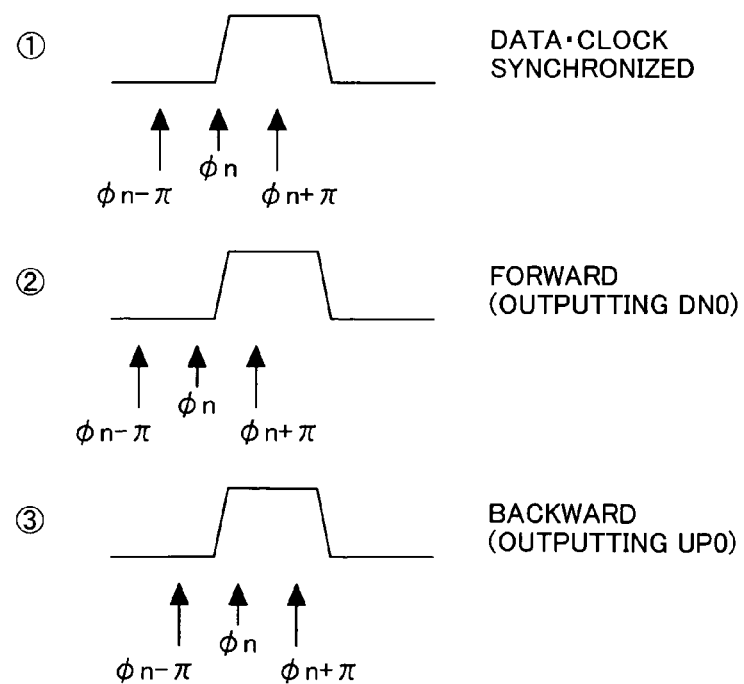
FIG. 4 indicates a signal timing chart of the phase detect circuit in FIG. 3.
Figure 5:
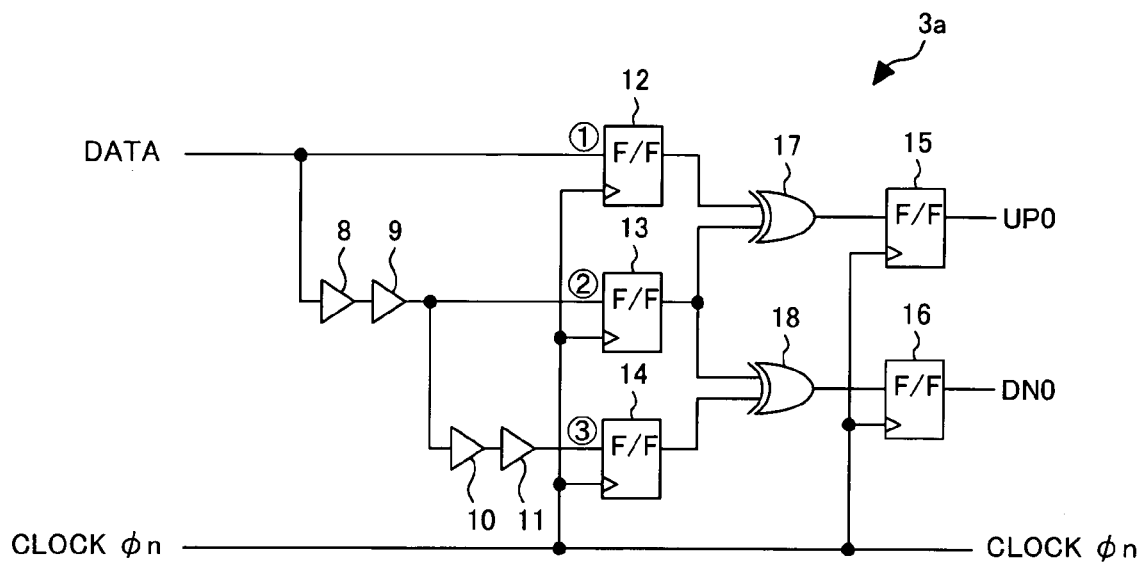
FIG. 5 is another example of a circuit diagram of a phase detect circuit without using multiphase clocks.
Figure 6:
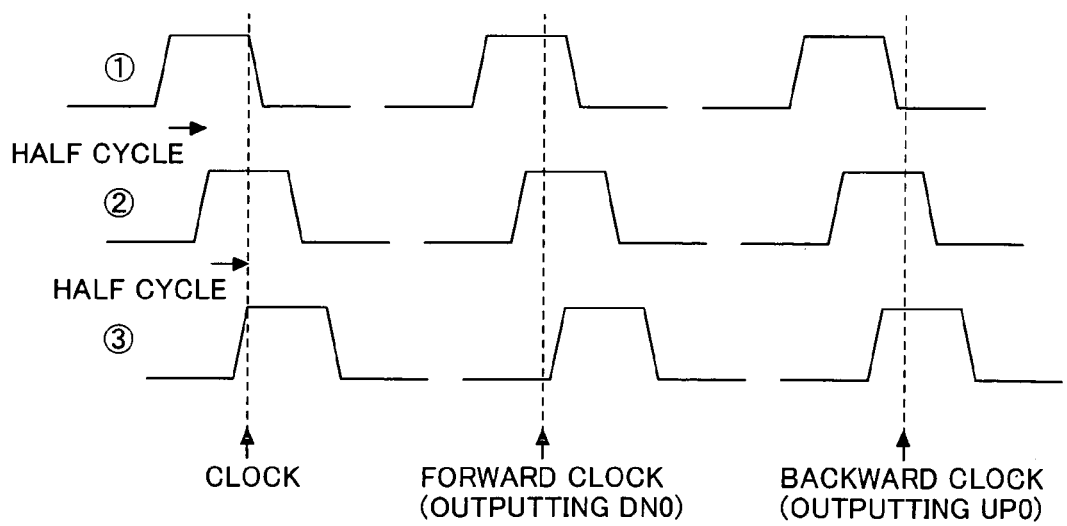
FIG. 6 is a signal timing chart in each part of the phase detect circuit in FIG. 5.
Figure 7:
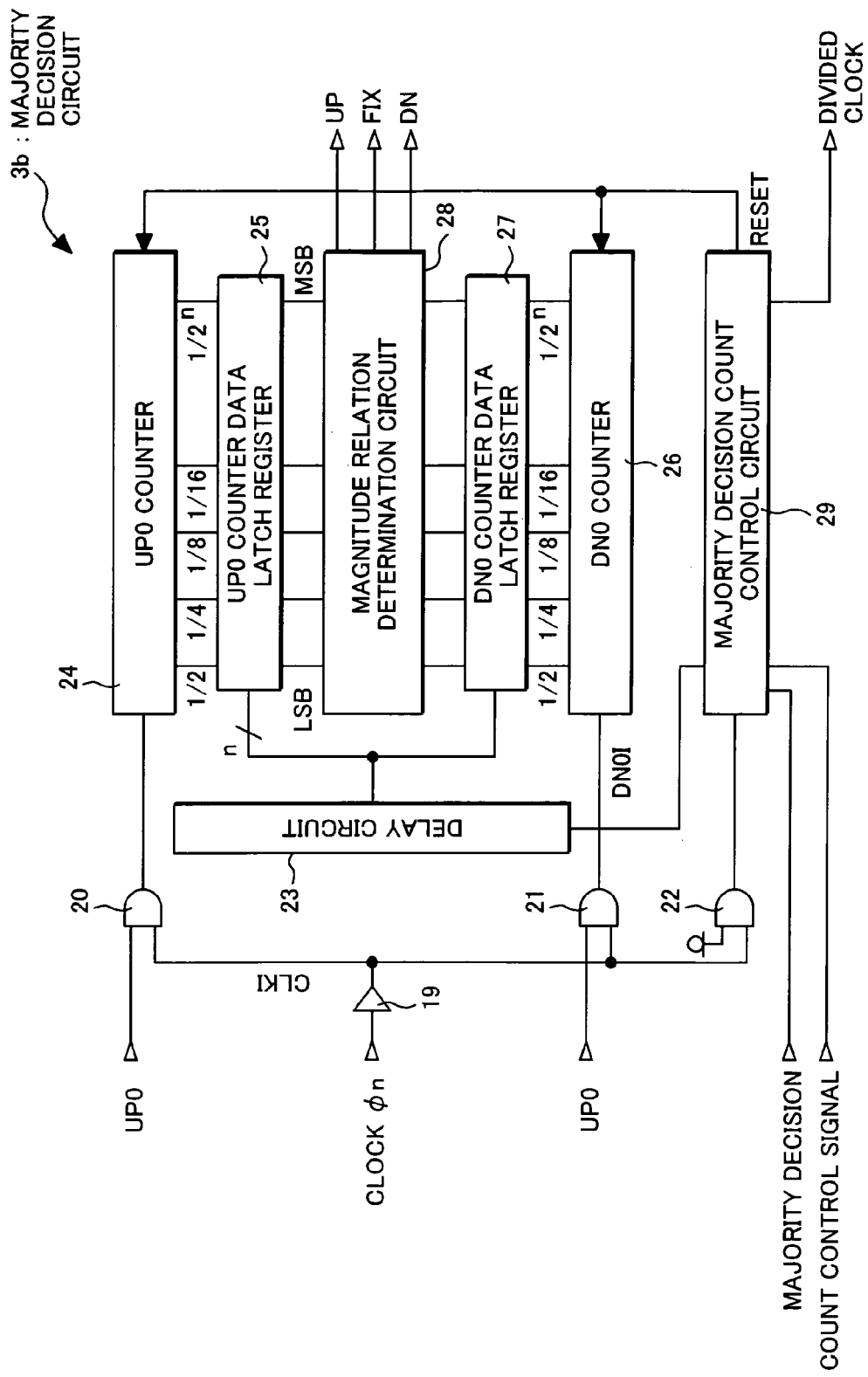
FIG. 7 is a circuit diagram of a majority decision circuit provided in the phase detect circuit in FIG. 2.
Figure 8:
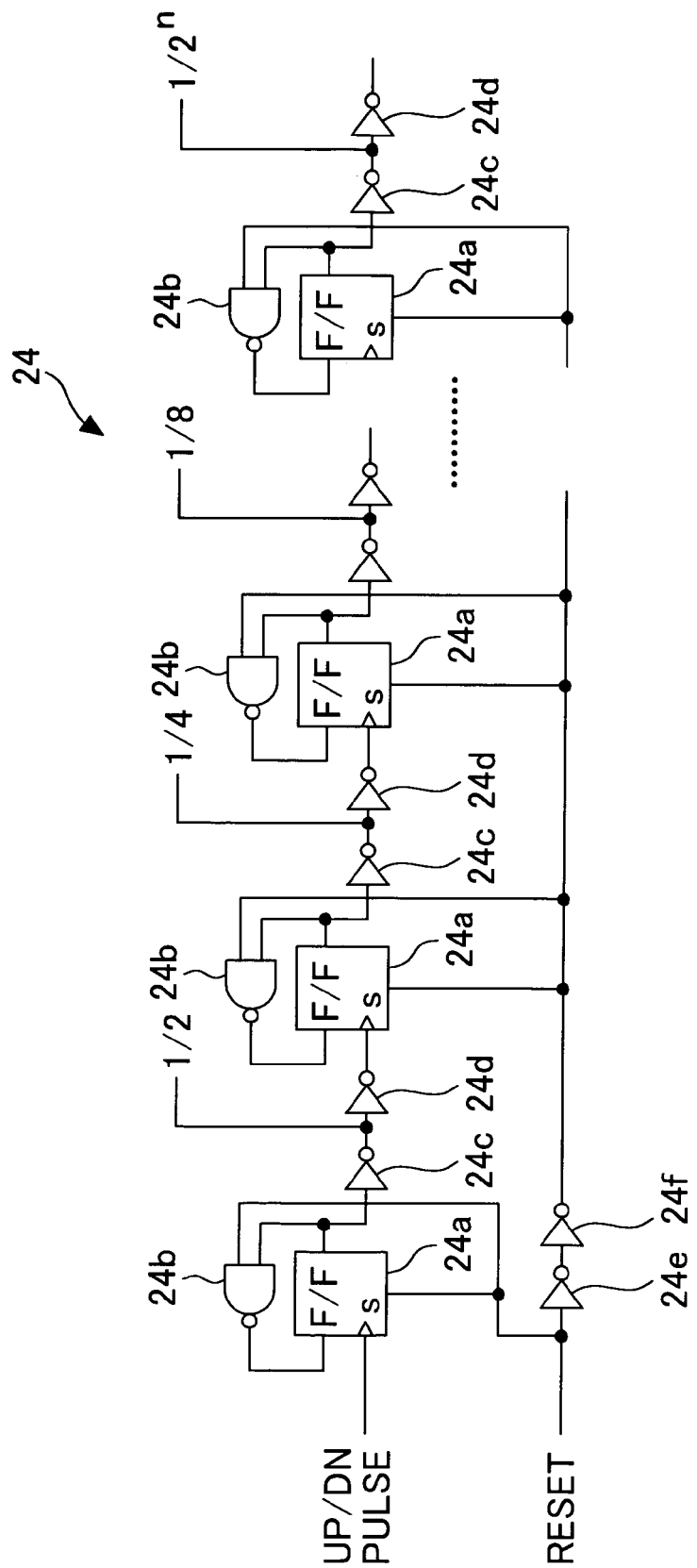
FIG. 8 is a circuit diagram of a UP0 counter provided in the majority decision circuit in FIG. 7.
Figure 9:
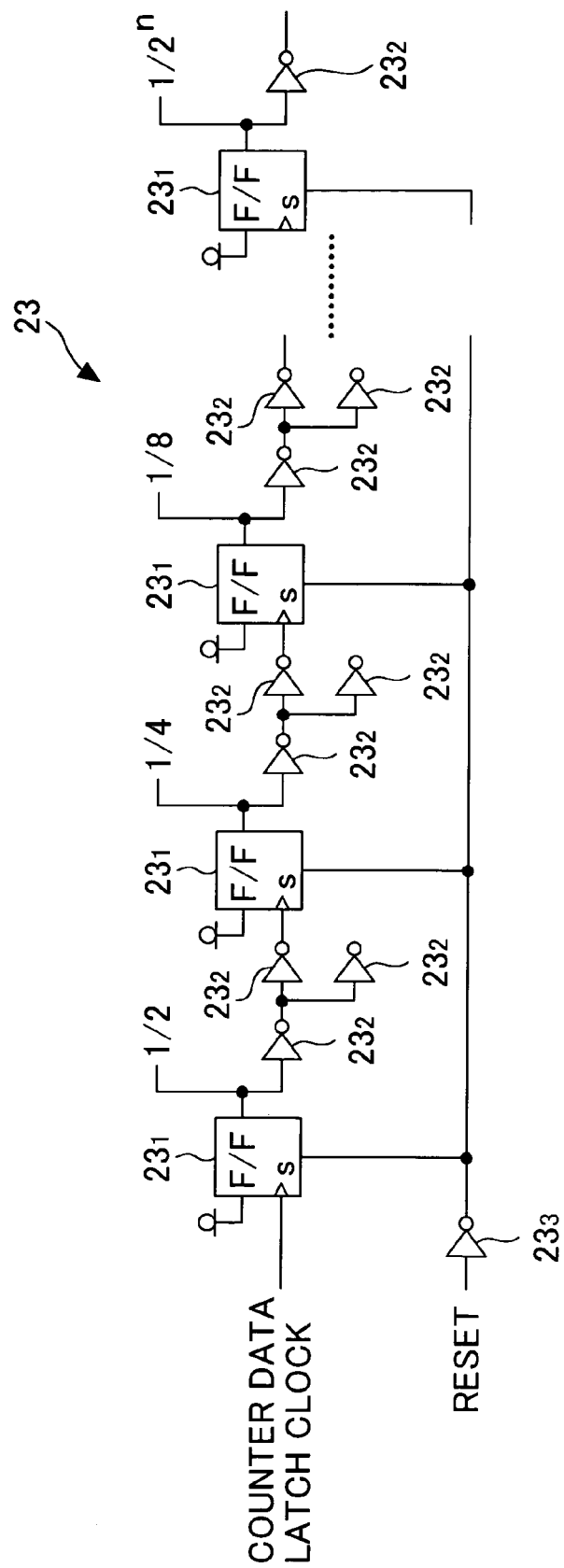
FIG. 9 is a circuit diagram of a delay circuit provided in the majority decision circuit in FIG. 7.
Figure 10:
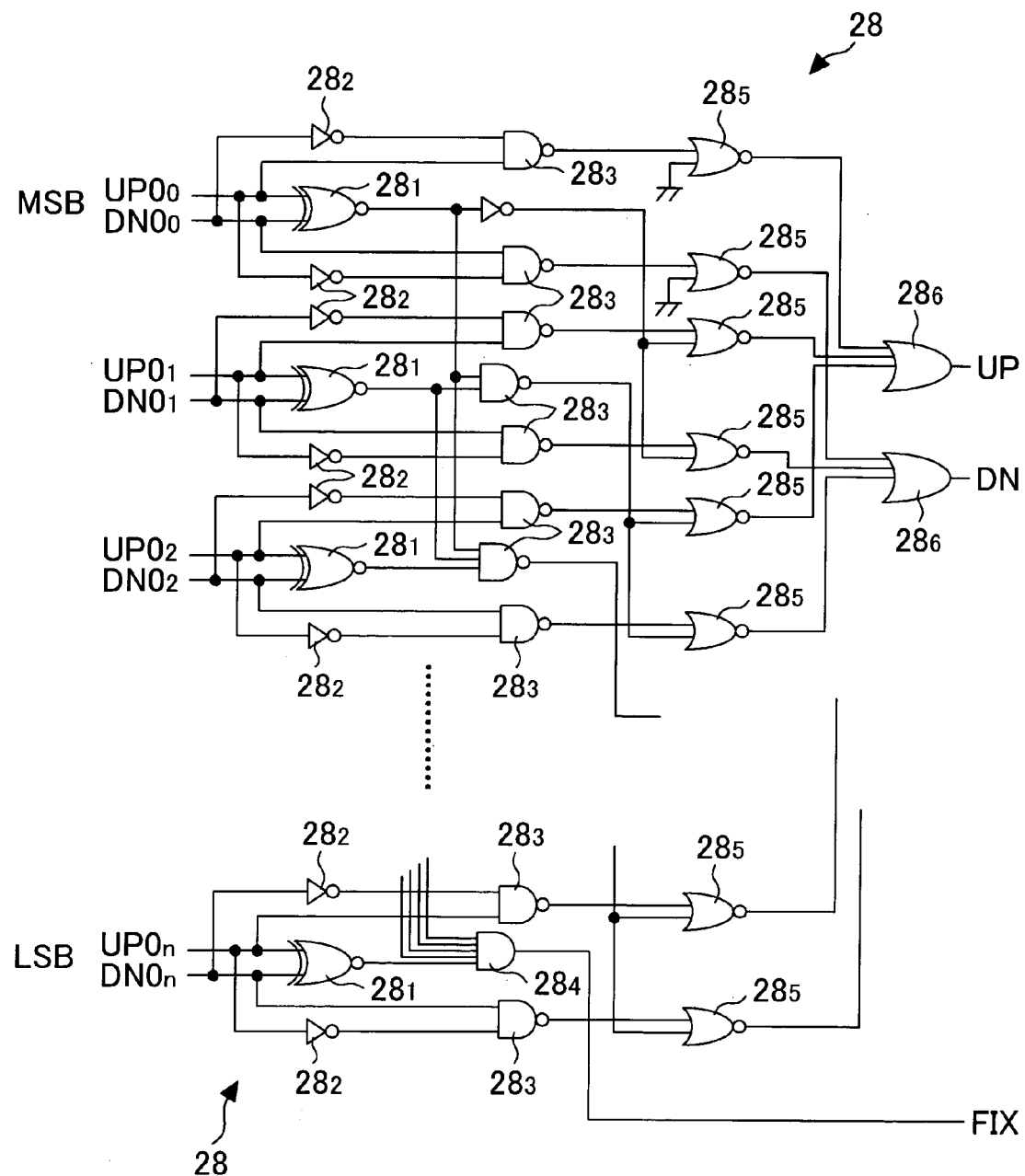
FIG. 10 is a circuit diagram of a magnitude relation determination circuit provided in the majority decision circuit in FIG. 7.
Figure 11:
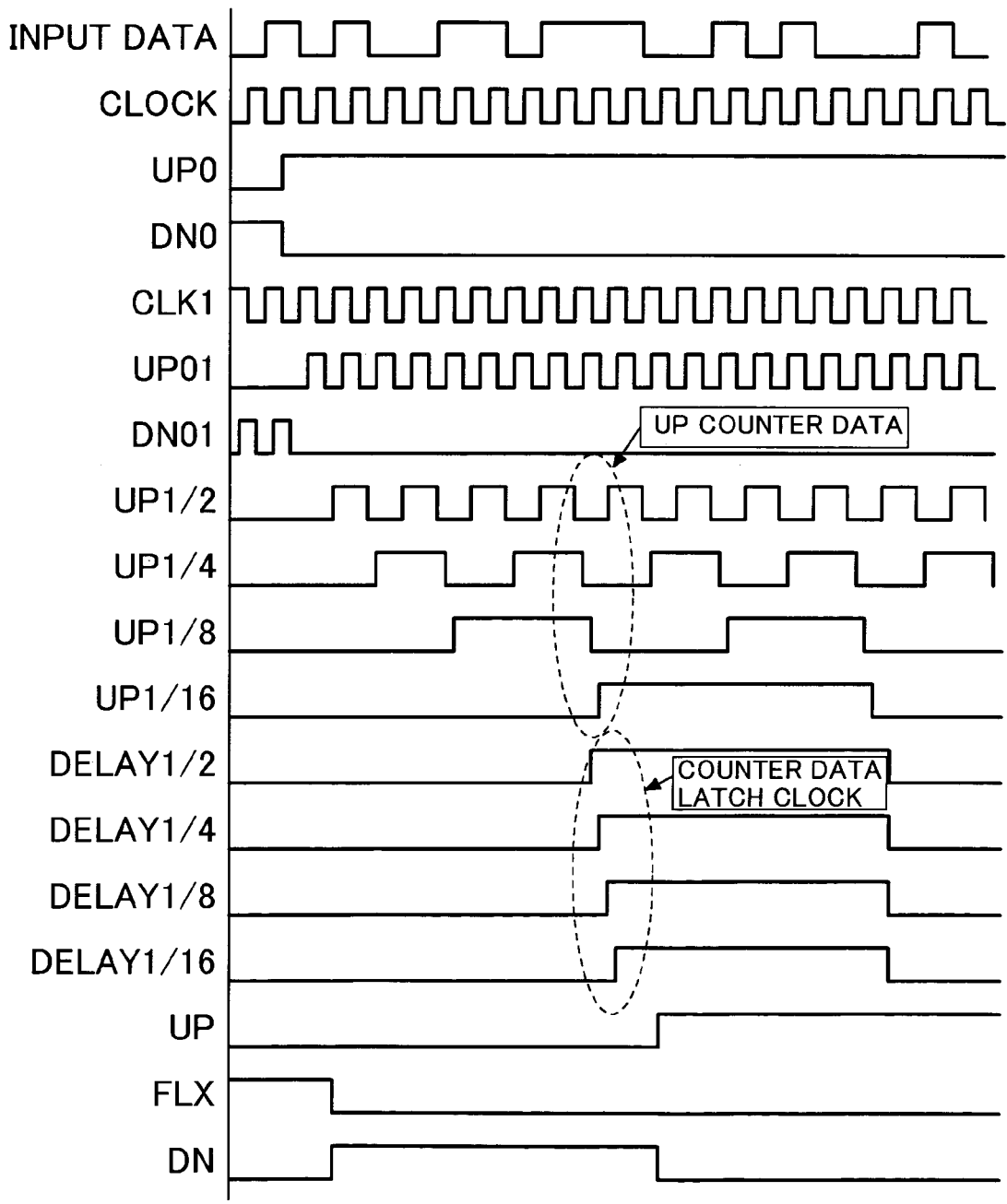
FIG. 11 is a timing chart of signal timing of each part of the phase detect circuit in FIG. 2.
Figure 12:
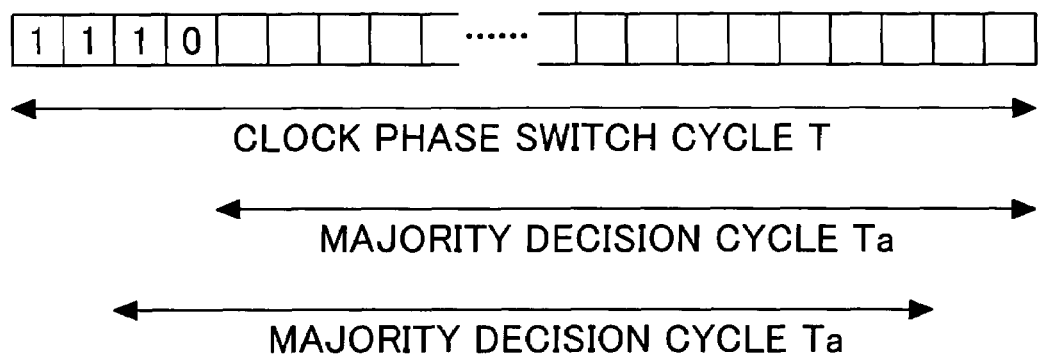
FIG. 12 is a view for explaining a method for setting a majority decision cycle of the majority decision circuit in FIG. 7.
Figure 13:
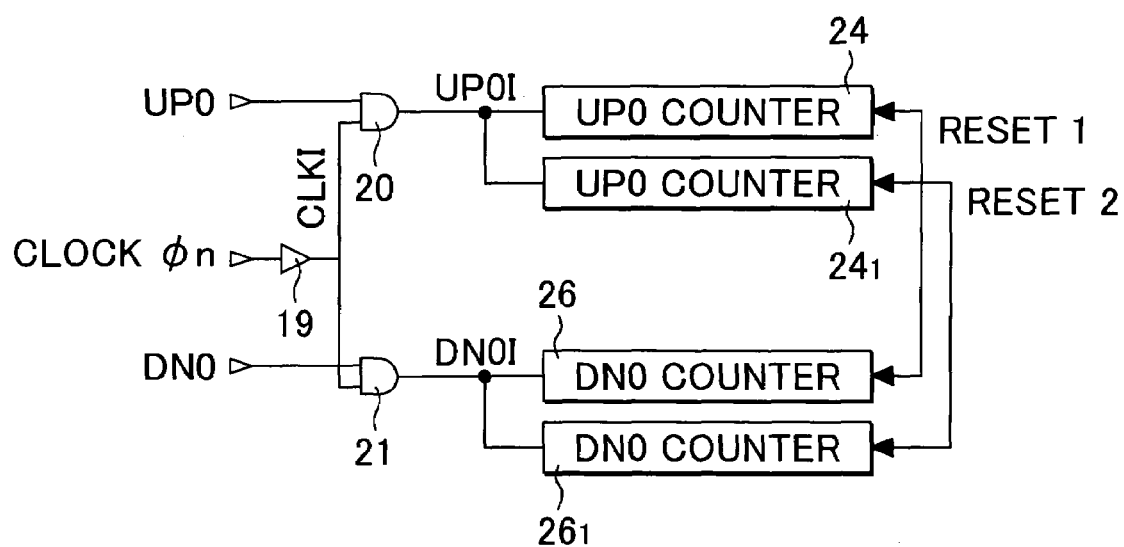
FIG. 13 is another circuit diagram of the majority decision circuit in FIG. 7.
Figure 14:
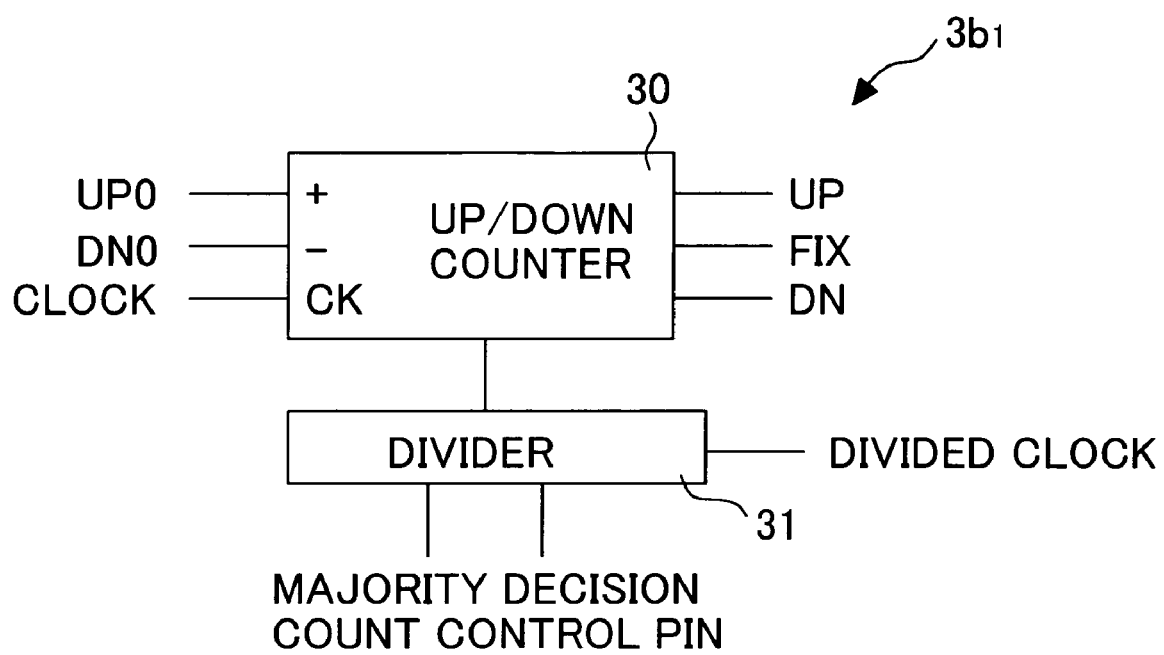
FIG. 14 is a block diagram showing an example in which the majority decision circuit in FIG. 7 is made by using an up/down counter.
Figure 15:
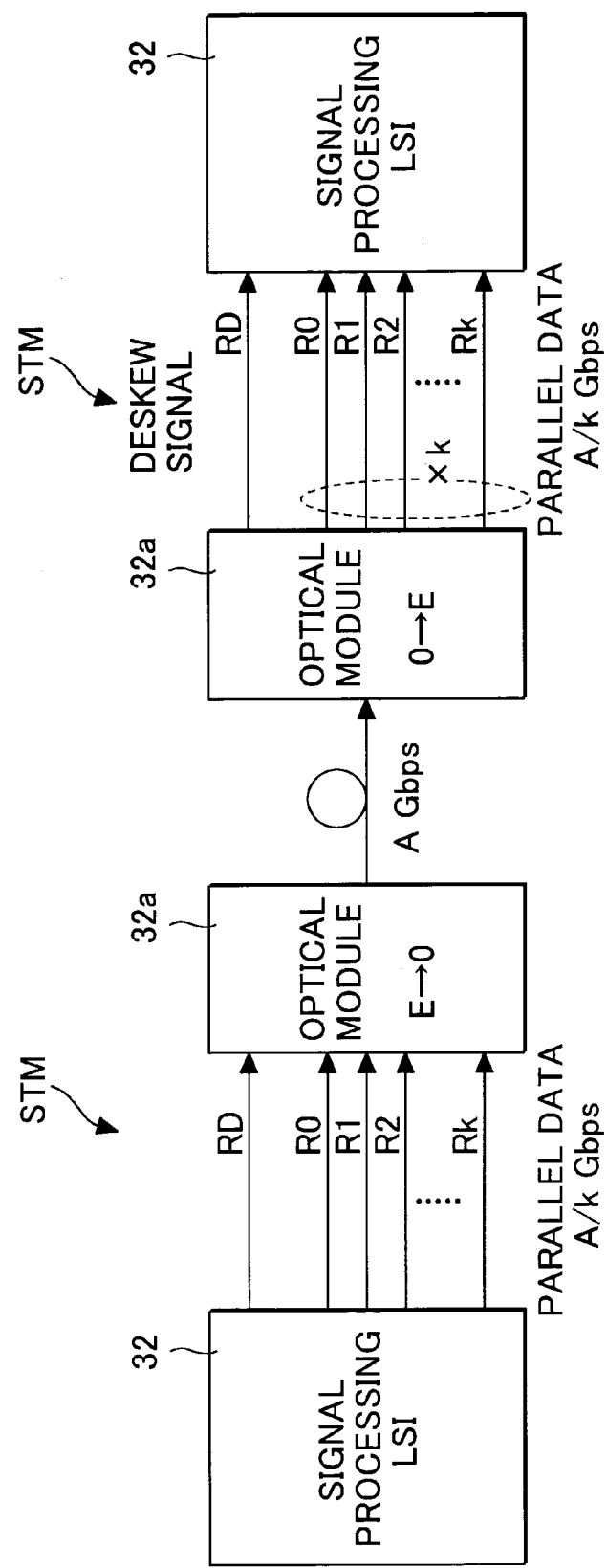
FIG. 15 is a block diagram showing a concept of a high-speed optical transmission system in the first embodiment of the present invention.
Figure 16:
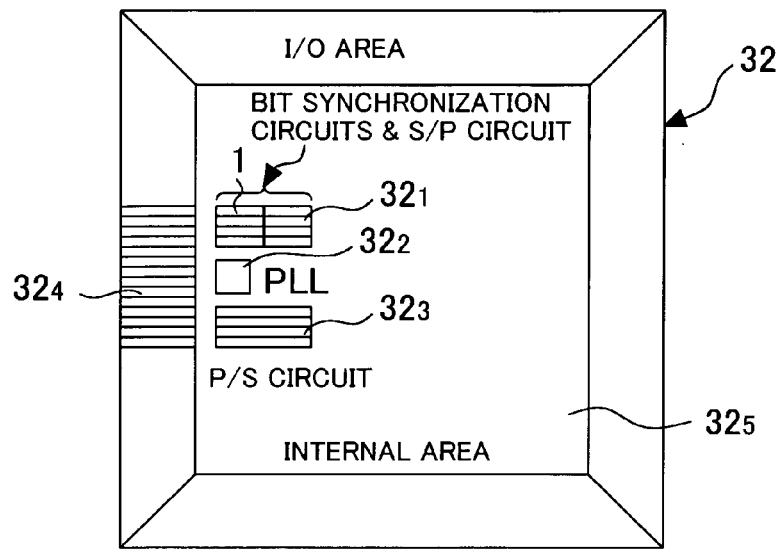
FIG. 16 is an explanatory view of a process LSI provided in the high-speed optical transmission system in FIG. 15.
Figure 17:
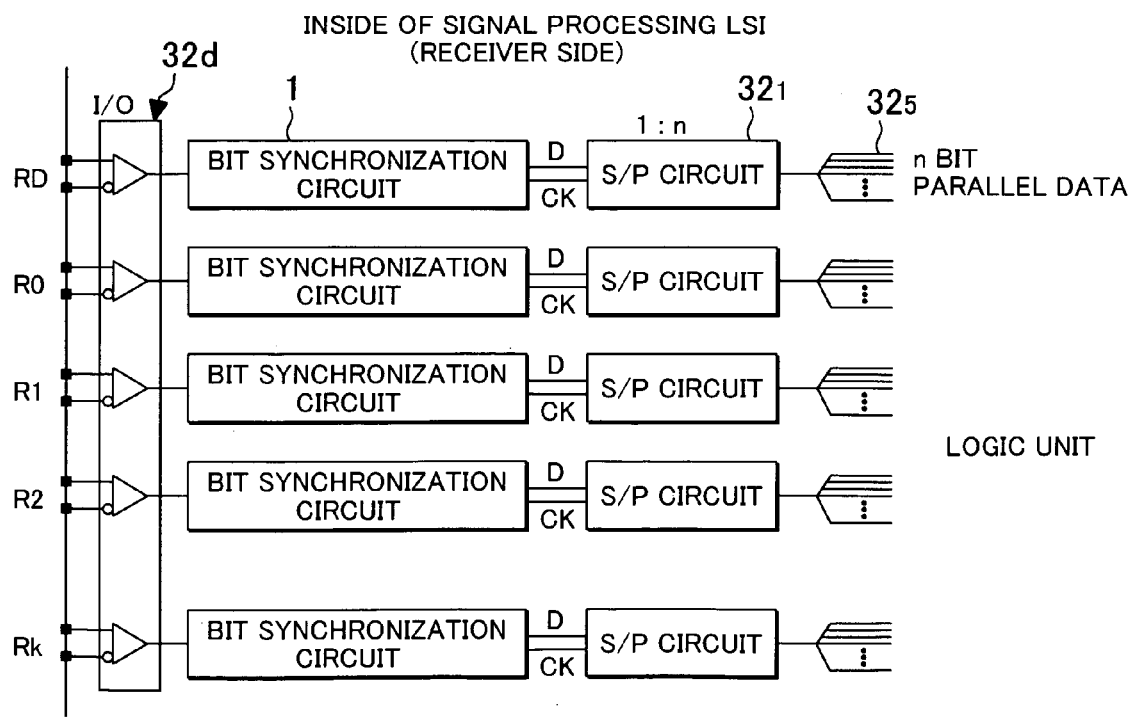
FIG. 17 is an explanatory view of a data receiving process of the process LSI in FIG. 16.
Figure 18:
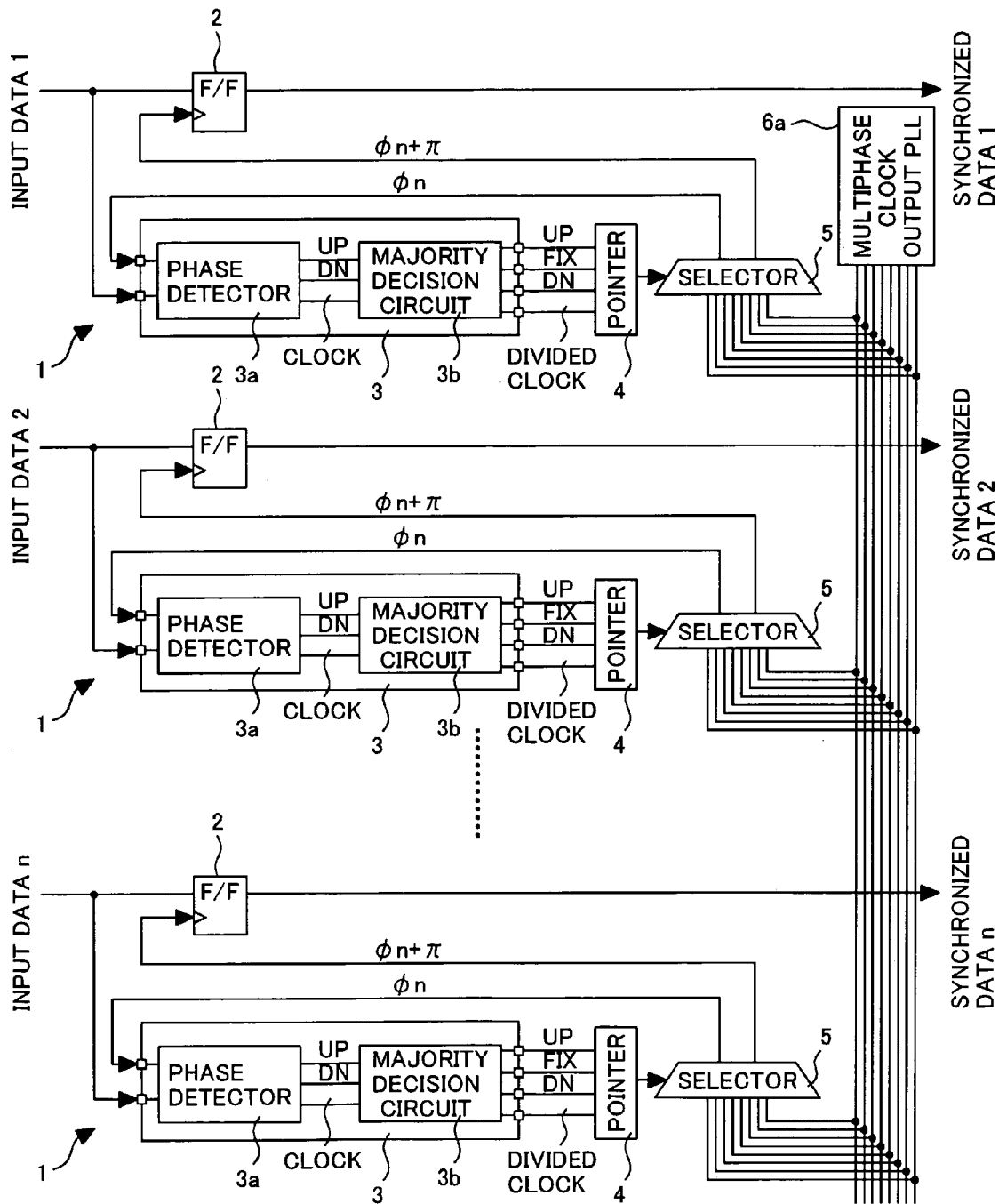
FIG. 18 is a circuit diagram showing an example in which plural bit synchronization circuits are provided in the process LSI in FIG. 15.

FIG. 1 is a block diagram of a bit synchronization circuit in the first embodiment of the present invention. FIG. 2 is a block diagram of a phase detect circuit using multiphase clocks provided in the bit synchronization circuit in FIG. 1. FIG. 3 is an example of a circuit diagram of a phase detect circuit using multiphase clocks. FIG. 4 shows a signal timing chart of the phase detect circuit in FIG. 3. FIG. 5 is another example of a circuit diagram of a phase detect circuit without using multiphase clocks. FIG. 6 shows a signal timing chart of each part of the phase detect circuit in FIG. 5. FIG. 7 is a circuit diagram of a majority decision circuit provided in the phase detect circuit in FIG. 2. FIG. 8 is a circuit diagram of a UP0 counter provided in the majority decision circuit in FIG. 7. FIG. 9 is a circuit diagram of a delay circuit provided in the majority decision circuit in FIG. 7. FIG. 10 is a circuit diagram of a magnitude relation determination circuit provided in the majority decision circuit in FIG. 7. FIG. 11 is a timing chart of signal timing of each part of the phase detect circuit in FIG. 2. FIG. 12 is a view showing a method for setting a majority decision cycle of the majority decision circuit in FIG. 7. FIG. 13 is another circuit diagram of the majority decision circuit in FIG. 7. FIG. 14 is a block diagram showing an example in which the majority decision circuit in FIG. 7 is made by using an up/down counter. FIG. 15 is a block diagram showing a concept of a high-speed optical transmission system in the first embodiment of the present invention. FIG. 16 is an explanatory view of a process LSI provided in the high-speed optical transmission system in FIG. 15. FIG. 17 is a view for explaining a data receiving process of the process LSI in FIG. 16. FIG. 18 is a circuit diagram showing an example in which plural bit synchronization circuits are provided in the process LSI in FIG. 15.

In the first embodiment of the present invention, a bit synchronization circuit 1, as shown in FIG. 1, includes a flip-flop 2, a phase detect circuit 3, a pointer 4, a selector 5, and a multiphase clock output PLL 6.

Input data are latched to the flip-flop 2 based on a clock $\phi n+\pi$ that is output from the selector 5. The phase detect circuit 3 performs phase comparison between input data and clock $\phi n$ that is output from the selector 5, and outputs any of control signals of an UP signal (up-signal), a FIX signal (FIX signal) and a DN signal (DOWN signal) and divided clocks, respectively.

The pointer 4 controls the selector 5 by receiving an UP, FIX, or DN signals. The selector 5 switches and outputs a clock phase, which is output from the multiphase clock output PLL 6, to the flip-flop 2 based on the control of the pointer. The multiphase clock output PLL 6 generates and outputs plural clocks.

FIG. 2 is the block diagram of the structure of the phase detect circuit 3.

The phase detect circuit 3 includes a phase detector 3a and majority decision circuit 3b. The input portions of the phase detector 3a compares respective phases of input data and clock $\phi n$ that are output from the selector 5, then a UP0 signal (first control voltage) or a DN0 signal (second control voltage) is output based on their comparison results. The clock $\phi n$ is a clock signal having a half cycle forward to the clock $\phi n+\pi$.

The majority decision circuit 3b is connected so as to input the UP0 or DN0 signal that is output from the phase detector 3a. This majority decision circuit 3b counts up the count of UP0 and DN0 signals with integral multiplication period of input clock $\phi n$ having longer period than the phase detector 3a. As a result of counting, the UP signals are output when UP0 signals are majority and the DN signals are output when DN0 signals are majority. Further, the FIX signals are output when the count of UP0 signals is equal to the count of DN0 signals.

FIG. 3 is an example of a circuit diagram of the phase detector 3a using multiphase clocks.

The phase detector 3a includes flip-flops 12' to 16' and exclusive-OR circuits 17' and 18'. The input terminals of flip-flops 12', 13', and 14' are connected in order for input data to be input, respectively.

The clock terminals of the flip-flops 13', 15', and 16' are connected in order for clock $\phi n$ to be input. Further, a clock $\phi n-\pi$ having a half cycle shift from the clock $\phi n$ is input to the clock terminal of the flip-flop 12' and the clock $\phi n+\pi$ having a half cycle shift from the clock $\phi n$ is input to the clock terminal of the flip-flop 14'.

The output terminal of the flip-flop 12' is connected to one side of the input portion of the exclusive-OR circuit 17', the output terminal of the flip-flop 13' is connected to the other side of the input portion of the exclusive-OR circuit 17' and one side of the input portion of the exclusive-OR circuit 18', and the output terminal of the flip-flop 14' is connected to the other side of the input portion of the exclusive-OR circuit 18'.

The output portion of the exclusive-OR circuit 17' is connected to the input terminal of the flip-flop 15' and the output portion of the exclusive-OR circuit 18' is connected to the input terminal of the flip-flop 16'.

Then, a signal that is output from the output terminal of the flip-flop 15' and a signal that is output from the output terminal of the flip-flop 16' are output as UP0 and DN0, respectively.

In the phase detector 3a, as shown in FIG. 4, input data having the clock $\phi n$ and clocks $\phi n-\pi$ and $\phi n+\pi$ having respective half cycle shifts are latched to flip-flops 12' to 14' and the outputs from these flip-flops 12' to 14' are exclusive ORed.

When the clock phase is delayed, the output from the exclusive-OR circuit 17' becomes a Hi signal and then the UP0 signal is output. When the clock has a forward phase, the output from the exclusive-OR circuit 18' becomes a Hi signal and then the DN0 signal is output.

FIG. 5 is another example of a circuit diagram of a phase detector 3a without using multiphase clocks.

The phase detector 3a includes delay circuits 8 to 11, flip-flops 12 to 16, and exclusive-OR circuits 17 and 18. The delay circuits 8 to 11 are composed of invertors, for example.

The input terminal of the flip-flop 12 and the input terminal of the delay circuit 8 are connected, respectively in order for input data to be input. The input portion of the delay circuit 9 is connected to the output portion of the delay circuit 8. Each of the input terminal of the flip-flop 13 and the input portion of the delay circuit 10 is connected to the output portion of the delay circuit 9. The delay circuits 8 and 9 are to delay a half cycle from the input data output by the delay circuit 9.

The input portion of the delay circuits 11 is connected to the output portion of the delay circuit 10, and the input portion of the flip-flop 14 is connected to the output portion of the delay circuit 11. The delay circuits 10 and 11 are to delay half cycle phase from the input data.

The clock terminals of the flip-flops 12 to 14, 15, and 16 are connected in order for the clock $\phi n$ to be input. The output terminal of the flip-flop 12 is connected to one side of the input portion of the exclusive-OR circuit 17 and the output terminal of the flip-flop 13 is connected to the other side of the input portion of the exclusive-OR circuit 17 and one side of the input portion of the exclusive-OR circuit 18, respectively.

The output portion of the exclusive-OR circuit 17 is connected to the input portion of the flip-flop 15. The output portion of the exclusive-OR circuit 18 is connected to the input portion of the flip-flop 16.

Then, a signal that is output from the output terminal of the flip-flop 15 and a signal that is output from the output terminal of the flip-flop 16 are output as a UP0 signal and a DN0 signal, respectively.

In the phase detector 3a, as shown in FIG. 6, input data and data having the half cycle delay from the foregoing input data and data having the one period delay from the foregoing data are latched to flip-flops 12 to 14 using the clock φn and the outputs from these flip-flops 12 to 14 are exclusive ORed.

When the clock phase is delayed, the output from the exclusive-OR circuit 17 becomes a Hi signal and the UP0 signal is output. When the clock phase is led, the output from the exclusive-OR circuit 18 becomes a Hi signal and the DN0 signal is output.

The circuit diagram of the phase detector 3a in FIGS. 3 and 5 is explained as an example and this circuit diagram is not limited.

FIG. 7 is a circuit diagram of the majority decision circuit 3b.

The majority decision circuit 3b includes a buffer 19, AND circuits 20 to 22, a delay circuit 23 such as a counter, a UP0 counter (first counter) 24, a UP0 counter data latch register (first data latch register) 25, a DN0 counter (second counter) 26, a DN0 count data latch register (second data latch register) 27, a magnitude relation determination circuit 28, and a majority decision count control circuit 29.

UP0 and DN0 signals and the clock φn are input to the majority decision circuit 3b. Pulses UP0I are generated when the UP0 signal is a Hi signal. Pulses DN0I are generated when the DN0 signal is a Hi signal.

The input portion of the buffer 19 is connected in order for the clock φn to be input. The output portion of the buffer 19 is connected to each one side of input portions of the AND circuits 20 to 22. The clock CLKI is output from the foregoing buffer 19.

One side of the input portions of the AND circuit 20 is connected in order for the UP0 signal, which is output from the phase detector 3a, to be input. One side of the input portions of the AND circuit 21 is connected in order for the DN0 signal, which is output from the phase detector 3a, to be input. Supply voltage is connected to one side of the input portions of the AND circuits 22.

The output portions of the AND circuits 20 and 21 are connected to the UP0 counter 24 and DN0 counter 26, respectively. These AND circuits 20 and 21 generate pulses UP0I and DN0I, respectively by synchronizing with the clock φn.

The UP0 counter 24 is connected to the UP0 counter data latch register 25, and the DN0 counter 26 is connected to the DN0 counter data latch register 27.

The delay circuit 23 is connected to the UP0 counter data latch register 25 and the DN0 counter data latch register 27. The majority decision count control circuit 29 is connected to the UP0 counter 24, the DN0 counter (second counter) 26, and the delay circuit 23.

The output portion of the AND circuit 22 is connected to the majority decision count control circuit 29, and the majority decision count control circuit 29 is connected in order for majority decision count control signal to be input from the outside.

The majority decision count due to this majority decision count control signal is approximately 32 to 256 bits, for example. The majority decision count is a count number of counting up to UP0 counter 24 and DN0 counter 26, respectively.

The UP0 counter 24 and DN0 counter 26 count pulses UP0I and pulses DN0I, respectively. Even if the count number is large, these UP0 counter 24 and DN0 counter 26 operate at high speed and power dissipation can be reduced, thus an asynchronous counter is used herein. However, if the counter number is small, a synchronous counter may be used.

The majority decision count control circuit 29 generates clocks supplied to the delay circuit 23, controls and resets the UP0 counter 24 and the DN0 counter 26, and generates divided clocks in accordance with the counter number used in the pointer 4 (FIG. 1).

Here, when the asynchronous counter is used in the UP0 counter 24 and the DN0 counter 26, all data up to MSB (Most Significant Bit: the highest bit) from LSB (Least Significant Bit: the lowest bit) of count data of the UP0 and DN0 signal having the same phase clocks cannot be latched. A clock phase delay is therefore adjusted by the delay circuit 23 having the same delay as the DN0 counter 26 and the UP0 counter 24. Further, the delay circuit 23 is not needed for the synchronous counter.

The magnitude relation determination circuit 28 determines the magnitude of data registered in the UP0 counter data latch register 25 and the DN0 counter data latch register 27.

Then, the magnitude relation determination circuit 28 outputs the UP signal when the count number of the UP0 counter data latch register 25 is large, the DN signal when the count number of the DN0 counter data latch register 27 is large, or the FIX signal when the count number of the UP0 counter data latch register 25 is equal to the count number of the DN0 counter data latch register 27.

FIG. 8 is an example of a circuit diagram of the UP0 counter 24. Although this FIG. 8 shows the UP0 counter 24, the DN0 counter 26 has the same circuit diagram.

The UP0 counter 24 includes flip-flops 24a, dispersion gates 24b, plural counter circuits composed of invertors 24c and 24d, and invertors 24e and 24f.

The clock terminal of the flip-flops 24a is connected in order for the pulses UP0I to be input, and the input terminal of the foregoing flip-flops 24a is connected to the output portion of the dispersion gates 24b.

The output terminal of the flip-flops 24a is connected to the other side of input portions of the dispersion gate 24b and the input portions of the invertor 24c. The output portion of the invertor 24c is connected to the input portion of the invertor 24d, and the signal that is output from the output portion of the foregoing inverter 24c is output to the UP0 counter data latch register 25.

The set terminal of the flip-flop 24a and the other side of the input portion of the dispersion gate 24b are connected in order for the reset signal, which is output from the majority decision count control circuit 29 (FIG. 7), to be input.

The above-described structure is the first stage of the counter circuit diagram. Other counter circuit diagrams have the same structure, and these counter circuit diagrams are connected serially. Further, the input portion of the invertor 24e is connected in order for the reset signal, which is output from the majority decision count control circuit 29 (FIG. 7) to be input. The output portion of the invertor 24e is connected to the input portion of the invertor 24f. The output portion of this invertor 24f is connected to the set terminals of the flip-flops 24a other than the first stage thereof.

As indicated in the drawings, the count number can be expanded easily to the number of 2n without increasing consumption power, by structuring the UP0 counter (first counter) 24 as the asynchronous counter. However, the asynchronous counter is not necessarily needed, but it may be a synchronous counter if the operating frequency has no problem.

FIG. 9 is an example of the circuit diagram of the delay circuit 23 such as the counter.

The delay circuit 23 includes an inverter $23_3$ and plural delay portions composed of flip-flops $23_1$ and inverters $23_2$, and these plural delay portions are connected serially. Further, the set terminals of the flip-flops $23_1$ are connected in order for the reset signal, which is output from the majority decision count control circuit 29 (FIG. 7), to be input via the inverter $23_3$.

When the asynchronous counters are used in the UP0 counter 24 and the DN0 counter 26, the whole delay is caused between LSB and MSB, which is calculated by multiplying the value of the number of stages by the delay of each inverter and each flip-flop of FIG. 8. Thus, data having a lock phase for the UP0 counter 24 and the DN0 counter 26 cannot be acquired at once.

Thus, the delay circuit 23 generates the clock signal having delay nearly equal to delay time of the UP0 counter 24 and the DN0 counter 26, and it is given to the UP0 counter data latch register 25 and the DN0 counter data latch register 27.

FIG. 10 is an example of a circuit diagram of the magnitude relation determination circuit 28.

The magnitude relation determination circuit 28 includes negative exclusive-OR circuits $28_1$, inverters $28_2$, negative AND circuits $28_3$, AND circuits $28_4$, negative OR circuits $28_5$, and OR circuits $28_6$.

The magnitude relation determination circuit 28 compares UP0 and DN0 signals sequentially from MSB and determines which one is a Hi signal. For example, in MSB, when the UP0 signal is a Hi signal and the DN0 signal is a Lo signal, it is judged that the UP0 signal is majority, and then the UP signal as a Hi signal is output. Further, when all of comparison results are the same from MSB to LSB, it is judged that each count number of UP0 and DN0 signals is equal to each other, and then the FIX signal is output.

Next, the phase detect circuit 3 provided in the bit synchronization circuit 1 of the present embodiment is explained with reference to a timing chart of FIG. 11.

FIG. 11 indicates, from the top to the bottom, signal timing of the input data, the clock φn, the UP0 and DN0 signals that are input to the majority decision circuit 3b, count data UP ½ to UP 1/16 that are output from the UP0 counter 24, delay signals DELAY ½ to DELAY 1/16 that are output from the delay circuit 23, the DN signal, the FIX signal, and the UP signal that is output from the majority decision circuit 3b.

Further, in FIG. 11, the clock φn for latching data is delayed than input data so as to draw figures simply and majority is decided if the count number (majority decision number) becomes 8 (8 bits).

First, the UP0 signal as the Hi signal is output from the phase detector 3a because the clock φn is delayed.

In the majority decision circuit 3b, the pulse UP0I is generated, and the number of pulses is counted by the UP0 counter 24. After the majority decision count control circuit 29 has counted pulses 8 times, which have been input via the AND circuit 22, the clocks for getting count data are generated and output to the delay circuit 23.

The delay circuit 23 generates delay signals DELAY ½ to DELAY 1/16 in which timing is delayed little by little. The UP0 counter 24 and the DN0 counter 26 get count data UP ½ to UP 1/16 of UP0 and DN0 signals using the delay signals DELAY ½ to DELAY 1/16.

Then, the magnitude relation determination circuit 28 determines magnitude relation of the count data that has been latched. In FIG. 11, the UP0 signal is 8 times and the DN0 signal is 0 time, thus the UP signal of the Hi signal is output from the magnitude relation determination circuit 28.

In the event that the clock φn is forward to input data, the DN0 signal is generated and operation is made in the same way as the case of the UP0 signal. In the event that each phase of the input data and the clock φn is nearly equal to each other, UP0 and DN0 signals are generated approximately half-and-half. In the event that each count number of the UP0 and DN0 signals is equal to each other, the FIX signal is output.

FIG. 12 is an explanatory view of setting majority decision cycle of the majority decision circuit 3b.

If a cycle of switching the multiphase clocks, which are output from the multiphase clock output PLL 6 (FIG. 1), through the selector 5 (FIG. 1) is defined as T in FIG. 12, a majority decision cycle Ta needs time for switching the UP0 counter 24 and the DN0 counter 26, thus Ta<T is obtained.

Accordingly, it is possible to adjust by the majority decision count control circuit 29 to decide which majority of comparison results, of a clock phase switch cycle T, shall be taken. However, since Ta=T cannot be taken as a rule, if Ta=T is taken, the majority decision circuit 3b shall include two UP0 counters 24 and $24_1$ and two DN0 counters 26 and $26_1$.

In this case, if the UP0 signal is counted by the UP0 counter 24 and the UP0 counter (first counter) $24_1$ alternately and the DN0 signal is counted by the DN0 counter 26 and the DN0 counter (second counter) $26_1$ alternately, Ta=T can be obtained.

FIG. 14 is an example of the majority decision circuit $3b_1$ using an up/down counter.

In this case, the majority decision circuit $3b_1$ includes an up/down counter 30 and a divider circuit (divider control circuit) 31. The UP0 and DN0 signals and the clock φn are input to the up/down counter 30.

Further, the divider circuit 31 is connected to the up/down counter 30, and the majority decision count control signal is input to the divider circuit 31.

The up/down counter 30 is shifted to the side of UP if the UP0 signal is input, and the up/down counter 30 is shifted to the side of DN if the DN0 signal is input. The majority decision count is controlled by the divider circuit 31, and the position of a pointer of the up/down counter 30 is decided at the position of a cycle of setting count by the majority decision count control signal. Then, the UP signal is output when it is in the side of UP, and the DN signal is output when it is in the side of DN, or the FIX signal is output when it is in the middle. The clock that is divided by the divider circuit 31 is output to the pointer 4 (FIG. 1).

FIG. 15 is a schematic diagram of a high-speed optical transmission system STM as one of electric systems. FIG. 16 is a schematic explanatory drawing of a process LSI (semiconductor integrated circuit system) 32.

The high-speed optical transmission system STM includes a signal processing LSI 32 and an optical module 32a. The bit synchronization circuits 1 are included in the side of receiving the signal processing LSI 32.

The signal processing LSI 32 includes the bit synchronization circuits 1, a serial to parallel circuit $32_1$, PLL $32_2$, a parallel to serial circuit $32_3$, an I/O circuit $32_4$, a Boolean element $32_5$, etc.

Plural bit synchronization circuits 1 are provided for each outside terminal to which serial data are input, and plural serial to parallel circuits $32_1$ are provided corresponding to the foregoing bit synchronous circuits, respectively.

FIG. 17 is a schematic diagram of receiving data in the signal processing LSI 32.

High-speed serial data that are input from the outside terminal are input to the bit synchronization circuit 1 via the I/O circuit $32_4$, and receiving data are synchronized with internal clocks of the signal processing LSI 32 in the foregoing bit synchronization circuit 1.

Synchronized clocks and data are parallel-converted as the ratio of 1:n by the serial to parallel circuit $32_1$ and then output to the Boolean element $32_5$.

FIG. 18 is a circuit diagram of an example in which plural bit synchronization circuits 1 are provided in the signal processing LSI 32.

In this way, in the case of providing plural bit synchronization circuits 1, one multiphase clock output PLL 6a that is connected to each selector 5 shall be included without providing the multiphase clock output PLL 6 in each bit synchronization circuit 1.

Therefore, according to the first embodiment of the present invention, since it is possible to prevent following excessively the jitters included in the input data by deciding majority of phase comparison results by the majority decision circuit 3b, an error rate of the bit synchronization circuit 1 can be reduced.

Figure 19:
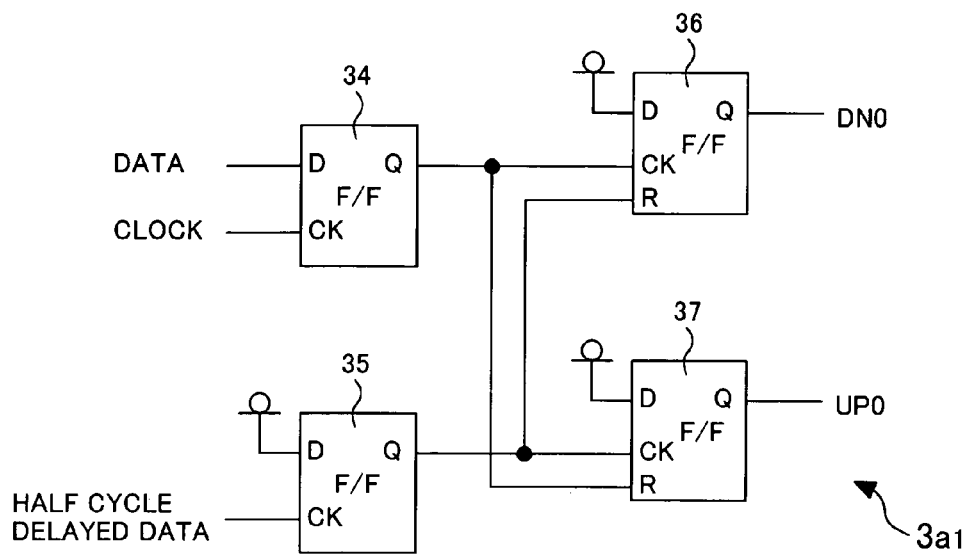
FIG. 19 is a circuit diagram of a phase detect circuit provided in the bit synchronization circuit in another embodiment of the present invention.

Further, although the case of a digital system as the phase detector 3a is described in the first embodiment, the phase detector $3a_1$ may be structured by an analog system circuit as shown in FIG. 19.

In this case, the phase detector $3a_1$ includes four flip-flops 34 to 37. An input terminal of the flip-flop 34 is connected in order for input data to be input, and each source voltage is supplied to each input terminal of flip-flops 35 to 37.

The clock terminal of the flip-flop 34 is connected in order for the clock φn to be input, and the clock terminal of the flip-flop 35 is connected in order for half cycle delay data to be input.

The output terminal of the flip-flop 34 is connected to the clock terminal of the flip-flop 36 and the reset terminal of the flip-flop 37, respectively. The output terminal of the flip-flop 35 is connected to the reset terminal of the flip-flop 36 and the clock terminal of the flip-flop 37.

The DN0 signal is output from the output terminal of the flip-flop 36, and the UP0 signal is output from the output terminal of the flip-flop 37.

This phase detector $3a_1$ can adjust the UP0 and DN0 signals not to be output if phase difference between the input data and the clock φn is small by changing sensitivity of detecting the UP0 and DN0 signals.

Second Embodiment

Figure 20:
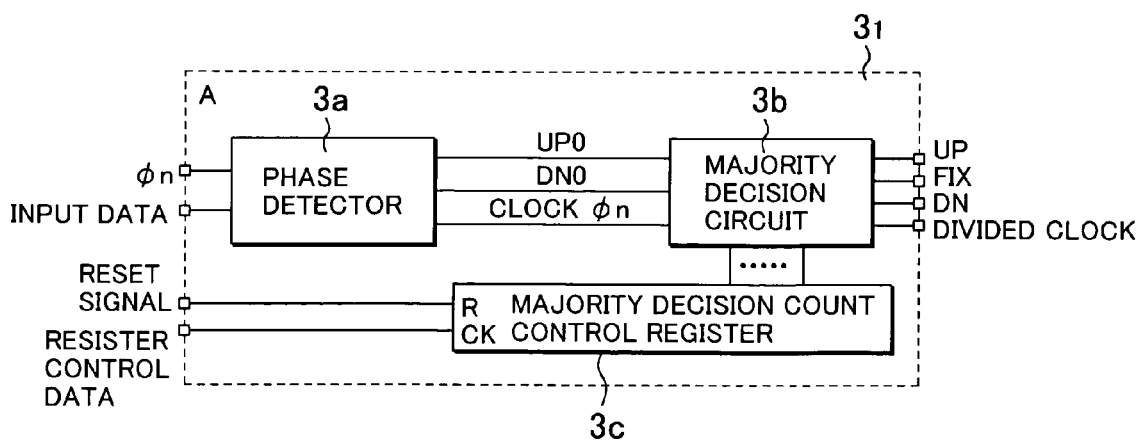
FIG. 20 is a block diagram of a phase detect circuit provided in a bit synchronous circuit in the second embodiment of the present invention.
Figure 21:
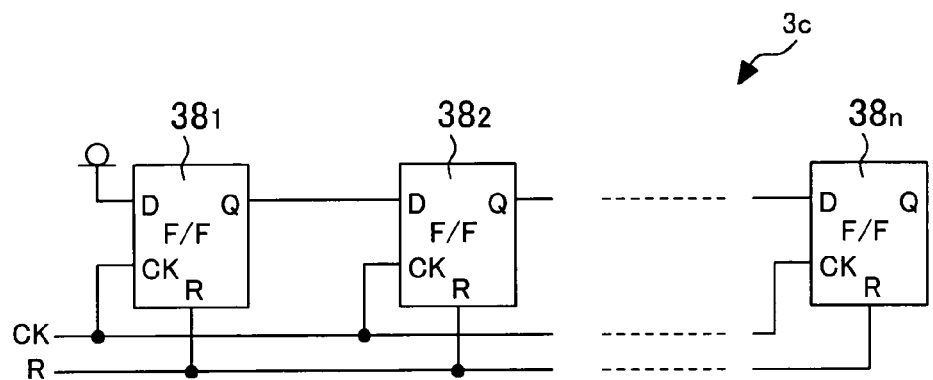
FIG. 21 is a circuit diagram showing an example of a majority decision count control register provided in the phase detect circuit in FIG. 20.
Figure 22:
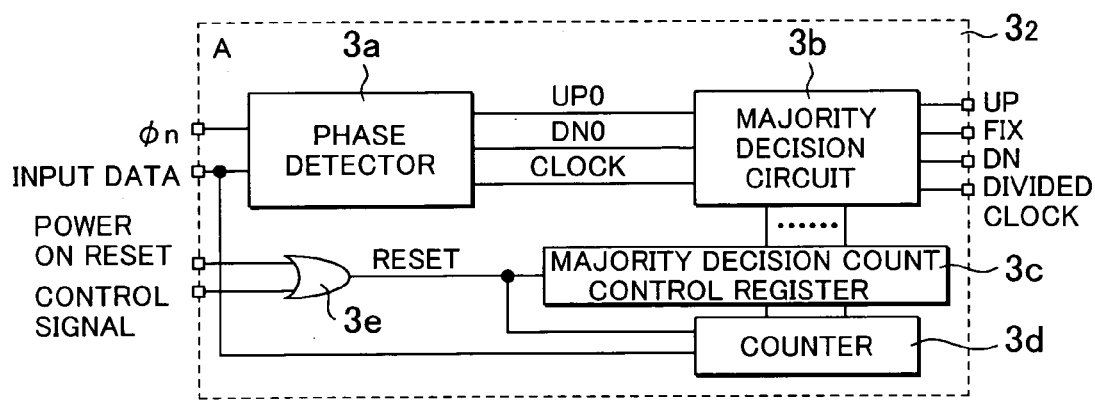
FIG. 22 is a block diagram showing another example of the phase detect circuit in FIG. 20.
Figure 23:
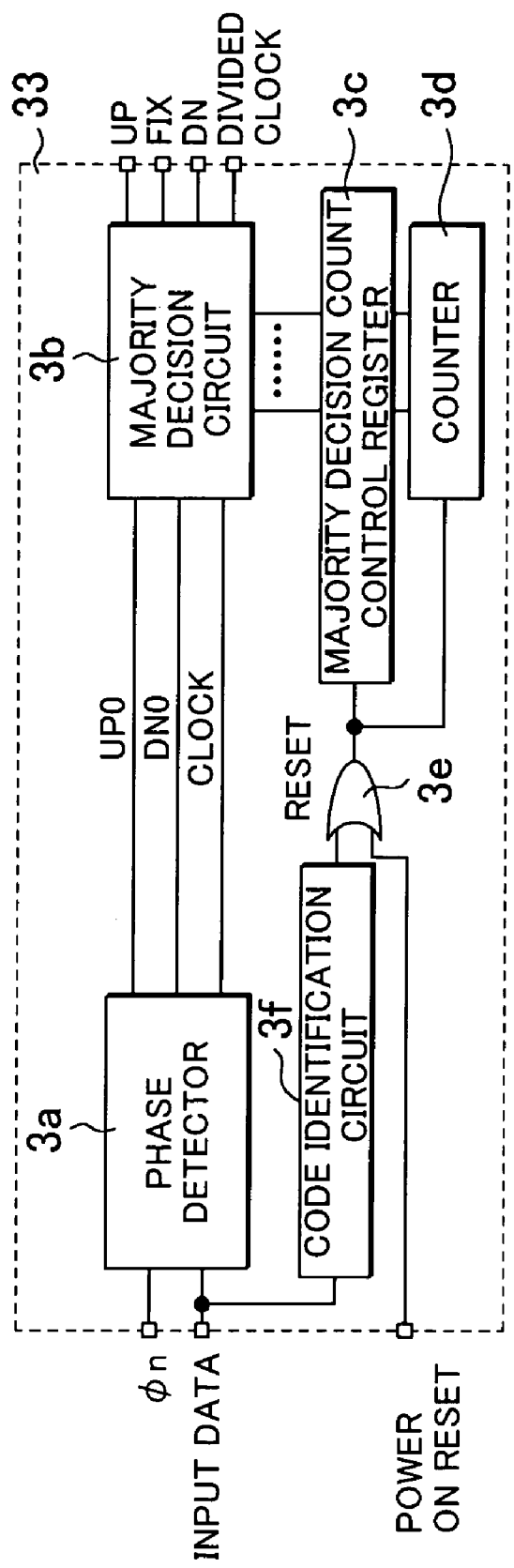
FIG. 23 is a block diagram of another example of the phase detect circuit in FIG. 22.

FIG. 20 is a block diagram of a phase detect circuit provided in a bit synchronous circuit in the second embodiment of the present invention. FIG. 21 is a circuit diagram of an example of a majority decision count control register provided in the phase detect circuit of FIG. 20. FIG. 22 is a block diagram of another example of the phase detect circuit of FIG. 20. FIG. 23 is a block diagram of another example of the phase detect circuit of FIG. 22.

In the second embodiment 2, the bit synchronous circuit includes the flip-flop 2, the phase detect circuit $3_1$, the pointer 4, the selector 5, and the multiphase clock output PLL 6.

A phase detect circuit $3_1$ includes the majority decision count control register 3c newly in addition to a circuit having the majority decision circuit 3b and the phase detector 3a in the same way as FIG. 5 of the foregoing embodiment.

The multiphase clock output PLL 6, the selector 5, the pointer 4, and the flip-flop 2 of a bit synchronous circuit are not explained herein because they have the same structure as those in the foregoing first embodiment.

In the phase detect circuit $3_1$, a majority decision count control register 3c is connected in order for the reset signal and the register control signal to be input, respectively. The majority decision count control register 3c sets a majority decision count by a register control signal.

The majority decision count control register 3c has a circuit diagram, as indicated in FIG. 21, in which plural flip-flops $38_1$ to 38n are connected in a multi-stage way. Then, the majority decision count is decided by the majority decision count control register 3c by the register control signal. Based on the majority decision count, the majority decision count control circuit 29 generates clocks that are given to the delay circuit 23, reset-controls the UP0 counter 24 and the DN0 counter 26, and generates the divided clocks in accordance with the count number used in the pointer 4 (FIG. 1).

FIG. 22 is a block diagram of another diagram of the phase detect circuit $3_2$.

The phase detect circuit $3_2$ includes the phase detector 3a, the majority decision circuit 3b, the majority decision count control register 3c, a counter 3d, and an OR circuit 3e. The input portion of the OR circuit 3e is connected in order for a power on reset signal and a control signal to be input, respectively.

The output portion of the OR circuit 3e is connected to one side of the input portions of the majority decision count control register 3c and the counter 3d, and the counter 3d is connected to the majority decision count control register 3c.

The other side of the input portion of the counter 3d is connected in order for the input data to be input. Further, the structure and a wiring system of the phase detector 3a, the majority decision circuit 3b, and the majority decision count control register 3c are the same as those in FIG. 20.

When the power on reset or reset signal is input to the OR circuit 3e, the majority decision count control register 3c and the counter 3d are reset. Then, the majority decision count of the majority decision count control register 3c is set (initialized) to be a minimum value when a reset condition is released.

Then, the counter 3d counts input data. After arbitrary count number or arbitrary time has passed, the majority decision count shall be set to be larger than the initialized value.

Accordingly, at the time of starting operation of the bit synchronization circuit, the phase of the data is synchronized with the phase of the clock φn instantly, thus the data can be obtained more stably by increasing the majority count after the data are synchronized with the clock φn.

FIG. 23 is a block diagram of a phase detect circuit 33 for a burst bit transfer system.

The burst bit transfer system needs to adjust the phase between data and clock φn instantly at the time of receiving data strings. This case uses a header code for indicating the top position of the data which is added to the data.

The phase detect circuit 33 includes the phase detector 3a, the majority decision circuit 3b, the majority decision count control register 3c, the counter 3d, the OR circuit 3e, and a code identification circuit 3f.

The code identification circuit 3f recognizes a header code included in the data and outputs a recognition signal. The input portion of the code identification circuit 3f is connected in order for the input data to be input. The output portion is connected to one side of the input portions of the OR circuit 3e. The other side of the input portions of the OR circuit 3e is connected in order for the power on reset to be input. Further, the structure and wiring system of the phase detector 3a, the majority decision circuit 3b, the majority decision count control register 3c, and the OR circuit 3e are the same as those in FIG. 22.

When the code identification circuit 3f recognizes the header code, the recognition code is output to the OR circuit 3e. Thus, the majority decision count control register 3c and the counter 3d are reset, respectively, and each majority decision count of the majority decision count control register 3c is reset. Accordingly, the majority decision count of the majority decision count control register 3c is set (initialized) to be a minimum value.

Then, the counter 3d counts the input data. After arbitrary count number or arbitrary time has passed, the majority decision count of the majority decision count control register 3c shall be set to be larger than the initialized value.

Further, the code identification circuit 3f may be included in a serial to parallel circuit, for example, for converting serial data into parallel data after synchronization by the bit synchronization circuit. Accordingly, the identification signal that is output from the foregoing serial to parallel circuit may be used.

Thus, in the second embodiment of the present invention, data synchronization time is shortened at the time of starting operation of the bit synchronization circuit, and further data after synchronizing the data with clock φn can be stabilized.

In this way, although the invention made by the inventor is explained concretely based on the embodiments of the invention, it goes without saying that the present invention is not limited to the foregoing embodiments but can be modified to various applications within the scope of the invention.

For example, although the foregoing first and second embodiments explain the bit synchronization circuit, a majority decision function may be included in the phase detect circuit provided in the digital PLL circuit and the digital DLL circuit.

In general, in the digital PLL circuit, the phase comparison results are output to the control circuit with the phase comparison period and the oscillation frequency of the foregoing digital PLL circuit is switched.

In this case, if the jitters of reference clocks are large, the digital PLL circuit tries to adjust the frequency and phase for the jitters of the reference clocks, thus output clock variation becomes large.

Figure 24:
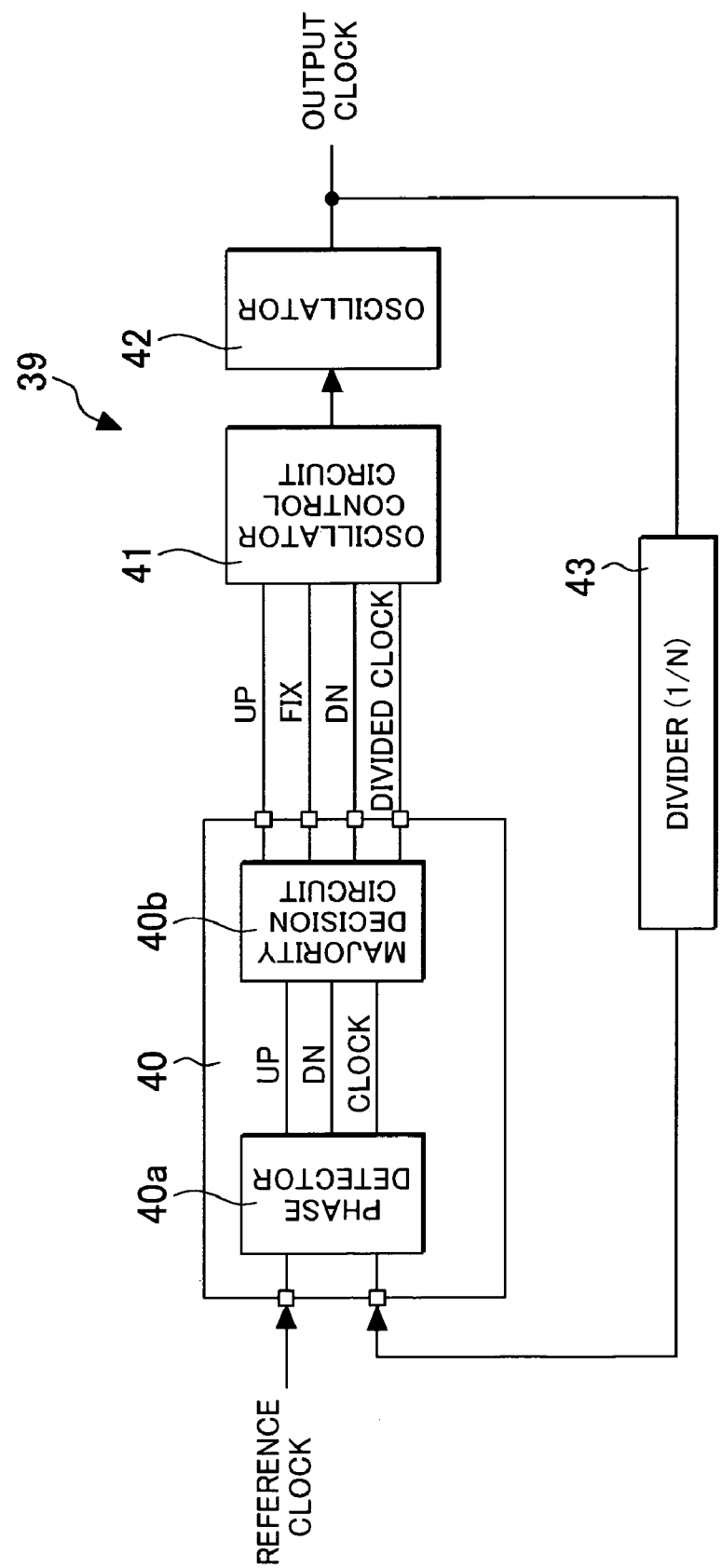
FIG. 24 is a block diagram of a digital PLL circuit in another embodiment of the present invention.

FIG. 24 is a block diagram of a digital PLL circuit 39 having the majority decision function.

The digital PLL circuit 39 includes a phase detect circuit 40, an oscillator control circuit 41, an oscillator 42, and a divider 43.

A feedback clock that is output from the divider 43 and the reference clock that is input from the outside are input to the input portions of the phase detect circuit 40, respectively. The output portion of the phase detect circuit 40 is connected to the oscillator control circuit 41.

The phase detect circuit 40 includes a phase detect circuit 40a and the majority decision circuit 40b, and outputs UP/DN/FIX signals and the divided clock. Further, each diagram of a phase detect circuit 40a and the majority decision circuit 40b is the same as that of the phase detector 3a and the majority decision circuit 3b indicated in the foregoing first and second embodiments. Thus, the explanation is omitted here.

The oscillator control circuit 41 generates control voltage based on any one of the UP/DN/FIX signals that are output from the phase detect circuit 40. The oscillator control circuit 41 is connected to the oscillator 42, and the output portion of the oscillator 42 is connected to the divider 43.

The oscillator 42 outputs an output clock having a changed oscillatory frequency based on control voltage that is output from the oscillator control circuit 41. The divider 43 divides the output clock generated by the oscillator 42 and outputs as a feedback clock signal.

Accordingly, the frequency of the oscillator 42 can be changed only if the real edge (central value of the jitters) of the reference clock deviates by controlling the oscillator 42 by a phase comparison result after majority decision processing, thus the amount of phase variation of the digital PLL circuit 39 can be suppressed to a large extent.

Further, a general DLL circuit changes the phase of the delay circuit by outputting the phase comparison results as the phase comparison period. In this case, if the reference clocks or the jitters of the data are large, the phase variation of the data or the clock, which is output from the foregoing DLL circuit, becomes large.

Figure 25:
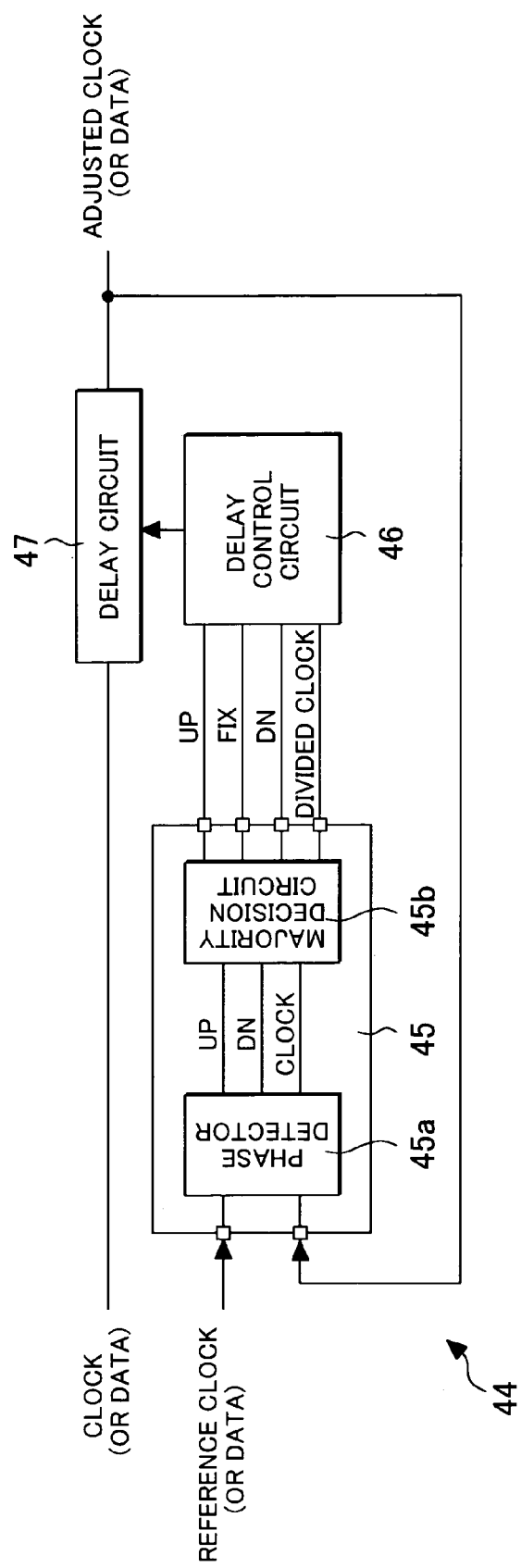
FIG. 25 is a block diagram of a digital DLL circuit another embodiment of the present invention.
Figure 26:
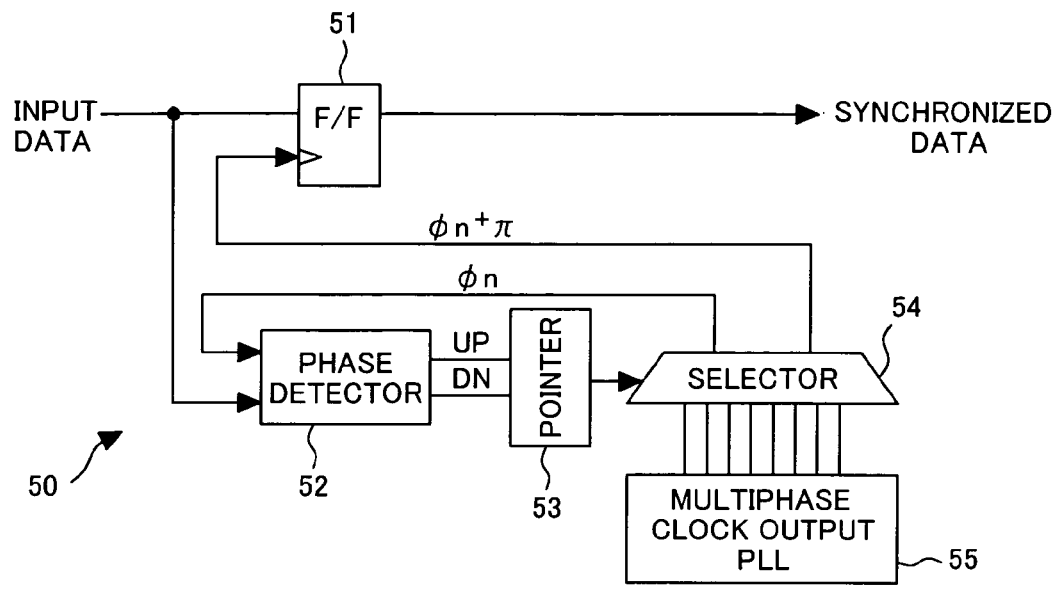
FIG. 26 is a block diagram of a bit synchronization circuit 50 which has been examined by the inventor.
Figure 27:
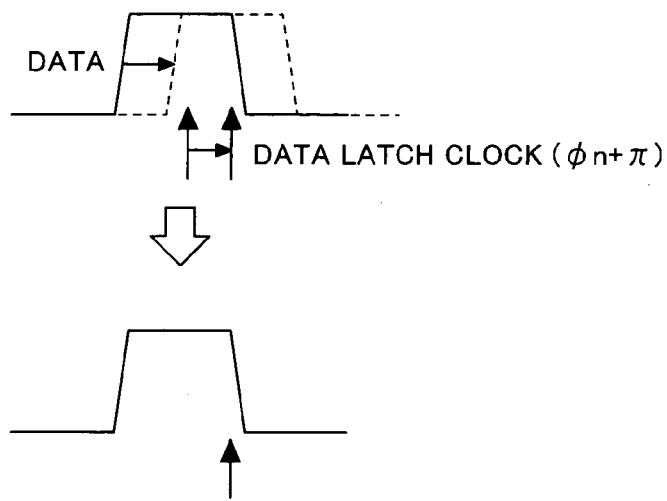
FIG. 27 is an explanatory view of a data latching error of the bit synchronization circuit of FIG. 26.

FIG. 25 is a block diagram of a digital DLL circuit 44 having the majority decision function.

The digital DLL circuit 44 includes a phase detect circuit 45, a delay control circuit 46, and a delay circuit 47.

An adjusted clock (or data) is input to the delay circuit 47. The adjusted clock (or data) that is output from the delay circuit 47 and the reference clock (or data) that is output from the outside are input to the input portion of the phase detect circuit 45, respectively.

The output portion of the phase detect circuit 45 is connected to the delay control circuit 46. The phase detect circuit 45 includes a phase detect circuit 45a and a majority decision circuit 45b, and outputs the UP/DN/FIX signals and the divided clock. Further, each diagram of the phase detect circuit 45a and the majority decision circuit 45b is the same as each diagram of phase detector 3a and the majority decision circuit 3b of the first and second embodiments, thus explanation is not given.

The delay control circuit 46 generates the control signal based on any one of UP/DN/FIX signals that are output from the phase detect circuit 45. The delay control circuit 46 is connected to the control terminal of the delay circuit 47, and the delay circuit 47 adjusts delay time based on the control signal that is output from the delay control circuit 46.

Since delay time can be changed only if the edge (central value of the jitters) of the reference clock (or data) deviates by controlling the delay circuit 47 by the phase comparison results after processing majority decision, the amount of clock (or data) phase variation can be reduced to a large extent.

According to the present invention, the following effects can be obtained.

(1) The error rate can be reduced to a large extent at the time of error synchronization since it is possible to prevent following the jitters included in input data, etc.

(2) The amount of phase variation of the PLL circuit, the DLL circuit, and so forth can be reduced to a large extent since it is possible to prevent following the jitters included in input data, etc.

(3) According to the foregoing (1) and (2), performance and reliability of a semiconductor integrated circuit device can be improved, and an electric system can be operated stably with high speed by structuring the electric system using the foregoing semiconductor integrated circuit device.

Although the present invention has been shown and described with respect to preferable embodiments thereof, it should be understood by those skilled in the art that the foregoing and various other changes, omissions, and additions in the form and detail thereof may be made therein without departing from the spirit and scope of the invention.

What is claimed is:

1. A semiconductor integrated circuit device, comprising a phase detect circuit including:

a phase detector for comparing phases between a first signal and a second signal and outputting first or second control voltage in accordance with difference of phases; and a majority decision circuit for counting first and second control voltages output from said phase detector for a fixed period of time, respectively and outputting an UP signal when said first control voltage count is larger than said second control voltage count, a DOWN signal when said second control voltage count is larger than said first control voltage count, or a FIX signal when said first control voltage count is equal to said second control voltage count, wherein the majority decision circuit comprises;

a first counter for counting the first control voltage;

a second counter for counting the second control voltage;

a first data latch register for latching count data given from said first counter;

a second data latch register for latching count data given from said second counter;

said first and second counters are asynchronous counters, said semiconductor integrated circuit device includes a delay circuit for generating clocks having a same delay time as said first and second counters, and clocks generated by said delay register circuit are used for latching count data of said first and second counters.

2. The semiconductor integrated circuit device according to claim 1, wherein said device includes a bit synchronization circuit having said phase detect circuit.

3. The semiconductor integrated circuit device according to claim 2, wherein said device includes a counter in which a majority decision count is set to an initial value by resetting said majority decision count control register when a reset signal is input, input data is counted after a reset condition is released, and a majority decision count having a count number larger than a majority decision count of said initial value is set in said majority decision count control register when an arbitrary count number is reached.

4. The semiconductor integrated circuit device according to claim 3, wherein said device includes a code identification circuit for recognizing a header code which is added to input data and outputting a recognition signal, and said counter sets a majority decision count of said initial value by resetting said majority decision count control register when a reset signal is input or an identification signal output from said code identification circuit, counts input data after releasing a reset condition, and sets a majority decision count having a count number larger than a majority decision count of said initial value in said majority decision count control register when an arbitrary count number is reached.

5. The semiconductor integrated circuit device according to claim 1, wherein said device includes two or more said first and second counters, respectively and counts first and second control voltages alternately.

6. The semiconductor integrated circuit device according to claim 1, wherein said device includes a PLL circuit having said phase detect circuit, to which a reference clock and a feedback clock dividing an output clock are input.

7. The semiconductor integrated circuit device according to claim 1, wherein said device includes a DLL circuit having said phase detect circuit, and to which a reference clock and an output clock being output from a delay circuit for generating an output clock by delaying an adjusting clock are input.

8. A semiconductor integrated circuit device, comprising a phase detect circuit including:

a phase detector for comparing phases between a first signal and a second signal and outputting first or second control voltage in accordance with difference of phases;

a majority decision circuit for counting first and second control voltage output from said phase detector for a fixed period of time, respectively and outputting an UP signal when said first control voltage count is larger than said second control voltage count, a DOWN signal when said second control voltage count is larger than said first control voltage count, or a FIX signal when said first control voltage count is 1 equal to said second control voltage count;

wherein the majority decision circuit comprises a majority decision count control register for storing majority decision count control data based on a majority decision count control signal;

a first counter for counting the first control voltage;

a second counter for counting the second control voltage;

a first data latch register for latching count data given from said first counter;

a second data latch register for latching count data given from said second counter; and said first and second counters are asynchronous counters, said semiconductor integrated circuit device includes a delay circuit for generating clocks having a same delay time as said first and second counters, and clocks generated by said delay register circuit are used for latching count data of said first and second counters.

9. The semiconductor integrated circuit device according to claim 8, wherein said device includes a PLL circuit having said phase detect circuit, to which a reference clock and a feedback clock dividing an output clock are input.

10. The semiconductor integrated circuit device according to claim 8, wherein said device includes a DLL circuit having said phase detect circuit, and to which a reference clock and an output clock being output from a delay circuit for generating an output clock by delaying an adjusting clock are input.

11. The semiconductor integrated circuit device according to claim 1, wherein said majority decision circuit can change a period of counting said first and second control voltages output from said phase detector based on a period setup signal.

12. The semiconductor integrated circuit device according to claim 8, wherein said majority decision circuit can change a period of counting said first and second control voltages output from said phase detector based on a period setup signal.

* * * * *